(12) United States Patent
Ware et al.

(10) Patent No.: US 9,490,002 B2
(45) Date of Patent: Nov. 8, 2016

(54) REDUCED REFRESH POWER

(71) Applicant: Rambus Inc., Sunnyvale, CA (US)

(72) Inventors: Frederick A. Ware, Los Altos Hills, CA (US); Brent S. Haukness, Monte Sereno, CA (US); Scott C. Best, Palo Alto, CA (US); Gary B. Bronner, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/801,558

(22) Filed: Jul. 16, 2015

(65) Prior Publication Data

US 2016/0027498 A1    Jan. 28, 2016

Related U.S. Application Data

(60) Provisional application No. 62/028,537, filed on Jul. 24, 2014.

(51) Int. Cl.
*G11C 7/00* (2006.01)
*G11C 11/406* (2006.01)

(52) U.S. Cl.
CPC .. *G11C 11/40611* (2013.01); *G11C 2211/4061* (2013.01)

(58) Field of Classification Search
CPC ............... G11C 11/401; G11C 2029/0401; G11C 29/44; G11C 29/4401; G11C 29/848; G11C 11/40611; G11C 11/40615; G11C 11/406; G11C 11/40618; G11C 2211/4061; G11C 7/02; G11C 7/1072; G11C 11/40626; G11C 11/40622; G11C 8/12; G11C 11/4076; G11C 8/06; G11C 8/18; G11C 2211/4067

USPC .............. 365/222, 189.04, 189.05, 194, 200, 365/211, 193, 233.1, 233.5, 236, 189.011, 365/189.07, 201, 230.03, 120, 154

See application file for complete search history.

(56) References Cited

U.S. PATENT DOCUMENTS

| 4,317,169 A | 2/1982 | Panepinto, Jr. et al. |
| 5,193,165 A | 3/1993 | Eikill et al. |
| 6,370,612 B2 | 4/2002 | Feierbach |

(Continued)

OTHER PUBLICATIONS

Ahn et al., "Adaptive Self Refresh Scheme for Battery Operated High-Density Mobile DRAM Applications," 2006 IEEE Asian Solid-State Circuits Conference, ASSCC 2006, pp. 319-322, Nov. 13-15, 2006. 4 pages.

(Continued)

*Primary Examiner* — Thong Q Le
(74) *Attorney, Agent, or Firm* — The Neudeck Law Firm, LLC

(57) ABSTRACT

N out of every M number of refresh commands are ignored (filtered out) by a buffer chip on a memory module. N and M are programmable. The buffer receives refresh commands (e.g., auto-refresh commands) from the command-address channel, but does not issue a proportion of these commands to the DRAMs on the module. This reduces the power consumed by refresh operations. The buffer may replace some auto-refresh (REF) commands with activate (ACT) and precharge (PRE) commands directed to specific rows. These rows may have known 'weak' cells that require refreshing more often than a majority of the other rows on the module (or component). By ignoring some auto-refresh commands, and directing some others to specific rows that have 'weak' cells, the power consumed by refresh operations can be reduced.

20 Claims, 17 Drawing Sheets

(56) References Cited

U.S. PATENT DOCUMENTS

| | | |
|---|---|---|
| 7,565,479 B2 | 7/2009 | Best et al. |
| 7,734,866 B2 | 6/2010 | Tsern |
| 7,742,355 B2 | 6/2010 | Kohler et al. |
| 8,397,100 B2 | 3/2013 | Blackmon et al. |
| 8,400,859 B2 | 3/2013 | Pelley, III et al. |
| 8,520,461 B2 | 8/2013 | Lee et al. |
| 8,566,516 B2 | 10/2013 | Schakel et al. |
| 8,588,017 B2 | 11/2013 | Park et al. |
| 8,601,207 B2 | 12/2013 | Mangione-Smith |
| 2007/0022245 A1 | 1/2007 | Sohn et al. |
| 2011/0060961 A1 | 3/2011 | Klein |
| 2011/0107022 A1 | 5/2011 | Gray et al. |
| 2012/0144106 A1 | 6/2012 | Bains |
| 2012/0204079 A1 | 8/2012 | Takefman et al. |
| 2013/0058145 A1 | 3/2013 | Yu et al. |
| 2014/0006705 A1 | 1/2014 | Yu et al. |
| 2014/0043919 A1 | 2/2014 | Schreck et al. |
| 2015/0003172 A1* | 1/2015 | Kim .................. G11C 11/40607 365/189.05 |

OTHER PUBLICATIONS

Baek et al., "Refresh Now and Then," IEEE Transactions on Computers, 2013, pp. 1-14. 14 pages.

Katayama et al., "Fault-Tolerant Refresh Power Reduction of DRAMs for Quasi-Nonvolatile Data Retention," 1999 International Symposium on Defect and Fault Tolerance in VLSI Systems, DFT '99, pp. 311-318, Nov. 1999. 8 pages.

Kim et al., "A New Investigation of Data Retention Time in Truly Nanoscaled DRAMs," Electron Device Letters, IEEE, vol. 30, No. 8, pp. 846-848, Aug. 2009. 3 pages.

Kim et al., "Block-Based Multi-Period Refresh for Energy Efficient Dynamic Memory," Proceedings of the 14th Annual IEEE International ASIC/SOC Conference, 2001, pp. 193-197. 5 pages.

Liu et al., "RAIDR: Retention-Aware Intelligent DRAM Refresh," Proceedings of the 39th Annual International Symposium on Computer Architecture, ISCA 2012, pp. 1-12. 12 pages.

* cited by examiner

REDUCED REFRESH POWER

RELATED APPLICATIONS

This application claims the benefit of U.S. Provisional Application No. 62/028,537, filed on Jul. 24, 2014, which is hereby incorporated by reference for all purposes.

DETAILED DESCRIPTION OF THE EMBODIMENTS

The following disclosure relates to, among other things, memory components that feature refresh command suppression and/or replacement. In an embodiment, a memory module can include a command-address buffer chip. This buffer helps isolate the electrical loading of the on-module Dynamic Random Access Memory (DRAM) chips from the command-address channel. In an embodiment, N out of every M number of refresh commands are ignored (filtered out) by the buffer. N and M are programmable. In other words, the buffer receives refresh commands (e.g., auto-refresh commands) from the command-address channel, but does not issue a proportion of these commands to the DRAMs on the module. Reducing the number of refresh operations results in less power being consumed.

In an embodiment, the buffer may replace some auto-refresh (REF) commands with activate (ACT) and precharge (PRE) commands directed to specific rows. Typically, these rows would have known 'weak' cells that require refreshing more often than a majority of the other rows on the module (or component). By ignoring some auto-refresh commands, and directing some others to specific rows that have 'weak' cells, the power consumed by refresh operations can be reduced without reducing data retention fidelity.

In an embodiment, a memory component may, in one or more modes, internally generate self-refresh events. These self-refresh events may be temperature compensated such that they only occur at a rate necessary to sustain the information in the memory component. A proportion of these self-refresh events may be ignored and/or replaced with refresh operations directed to specific rows. The self-refresh events may also be used to determine which auto-refresh commands received by the component are to be ignored, used to sequentially refresh rows, or replaced with refresh operations directed to specific rows. By only refreshing at a rate necessary to sustain the information in the memory component, and ignoring or replacing auto-refresh operations from the memory channel that occur more often than the necessary rate, the power consumed by refresh operations is reduced.

Figure 1A:
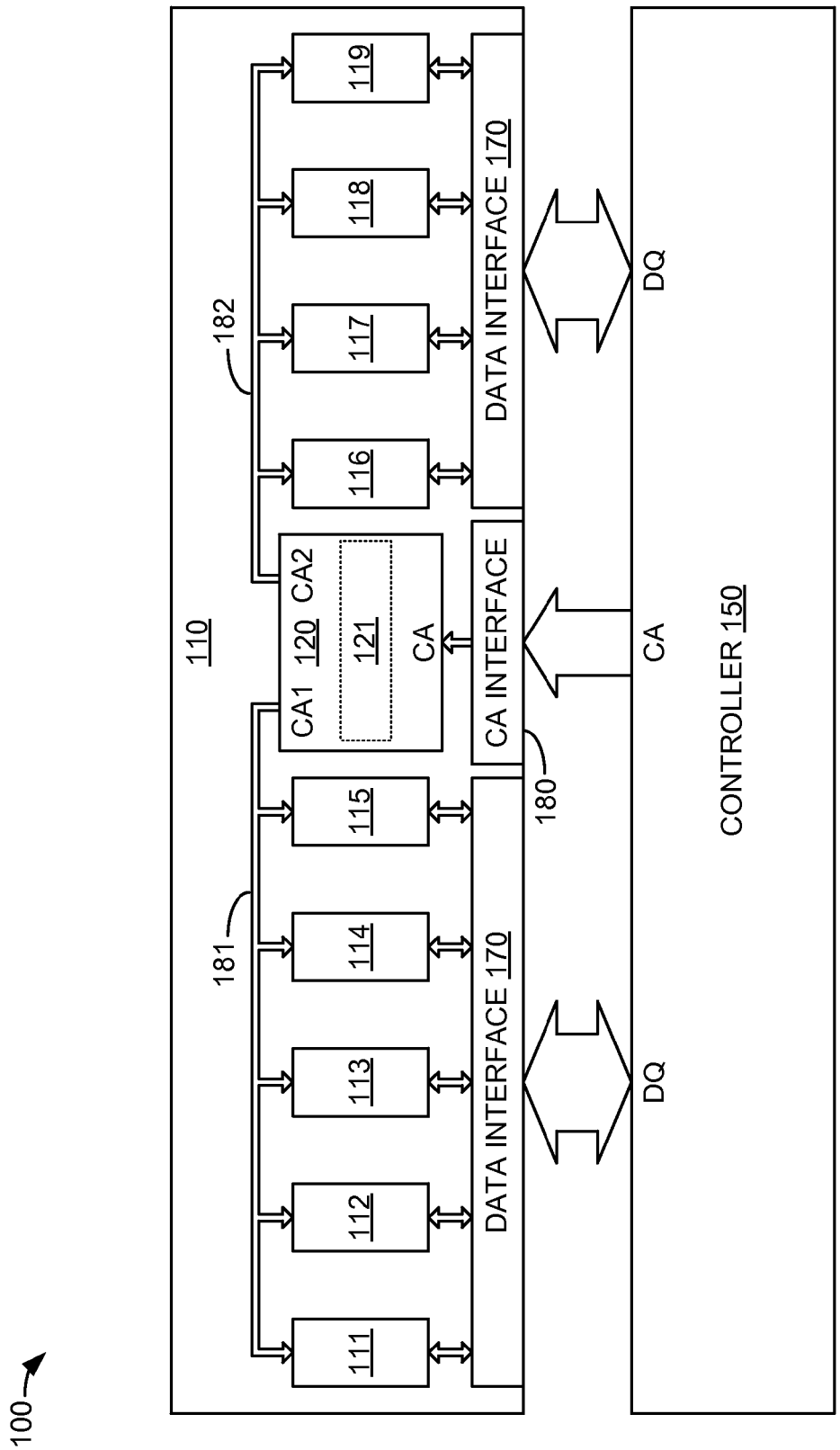
FIG. 1A is a block diagram of a memory system.

FIG. 1A is a block diagram of a memory system. In FIG. 1A, memory system 100 comprises controller 150 and module 110. Controller 150 is operatively coupled to module 110 via data signals (DQ) and command-address signals (CA). Module 110 includes memory components 111-119, buffer 120, data interface 170, and command-address interface 180. Command-address interface 180 is operatively coupled to buffer 120. Buffer 120 includes filter 121. Buffer 120 is operatively coupled to memory components 111-115 via secondary command-address signals CA1 181 (also referred to as CA bus 181). Buffer 120 is operatively coupled to memory components 116-119 via secondary command-address signals CA2 182 (also referred to as CA bus 182). Buffer 120 may also be referred to as a CA Register. Thus, module 110 may be considered to be a registered module, or Registered Dual Inline Memory Module (R-DIMM).

Controller 150 and memory components 111-119 may be integrated circuit type devices, such as are commonly referred to as a "chips". A memory controller, such as controller 150, manages the flow of data going to and from memory devices and/or memory modules. Memory components 111-119 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system such as a block of a system on a chip (SOC).

Buffer 120 is operatively coupled to CA interface 180 and memory components 111-119 to reduce the electrical loading placed on the CA signals from controller 150. Buffer 120 helps isolate the electrical loading of the on-module DRAM memory components 111-119 from the command-address channel coupled to controller 150. Without buffer 120, the aggregate load of memory components 111-119 would degrade the achievable signaling rate of the command-address channel and hence the overall bandwidth performance of the memory subsystem. In an embodiment, all command-address traffic sent between controller 150 and memory components 111-119 is first received by buffer 120 via CA interface 180 (also referred to as CA bus 180).

Memory components 111-119 can use internal refresh address generation. In other words, the address for any given auto-refresh command received by a memory component 111-119 is generated internally to the respective memory component 111-114. Thus, the addresses for the auto-refresh commands are not supplied by controller 150. In an embodiment, the address signals received by CA interface 180 for an auto-refresh command are specified to be in a "don't care" state.

When a memory component 111-119 receives an auto-refresh command, the respective memory component 111-119 internally generates the row address(es) for that auto-refresh cycle. Since all banks of a respective memory component 111-119 are precharged prior to an auto-refresh command, all banks (e.g., 16 banks for a DDR4 DRAM) can be simultaneously refreshed. This simplifies memory controller 150, as it just needs to issue 8192 (2^13) auto-refresh commands every refresh interval (e.g., 64 mS), and the memory components will generate the necessary number of internal refresh commands in response. E.g., a DDR4 DRAM with 16 banks and 16 row addresses per bank will auto-generate 128 refresh operations (2^16*16/2^13) for every externally received auto-refresh command. This approach greatly lessens the refresh overhead of the memory channel: an 800 MHz memory controller 150 needs to issue one refresh command approximately every 6250 non-auto-refresh command slots.

In an embodiment, buffer 120 includes filter 121. Filter 121 can be programmed such that buffer 120 ignores selected auto-refresh commands. For example, filter 121 can be programmed such that buffer 120 ignores N out of every M auto-refresh commands. N and/or M may be programmable (e.g., via a command on CA interface 180).

Figure 1B:
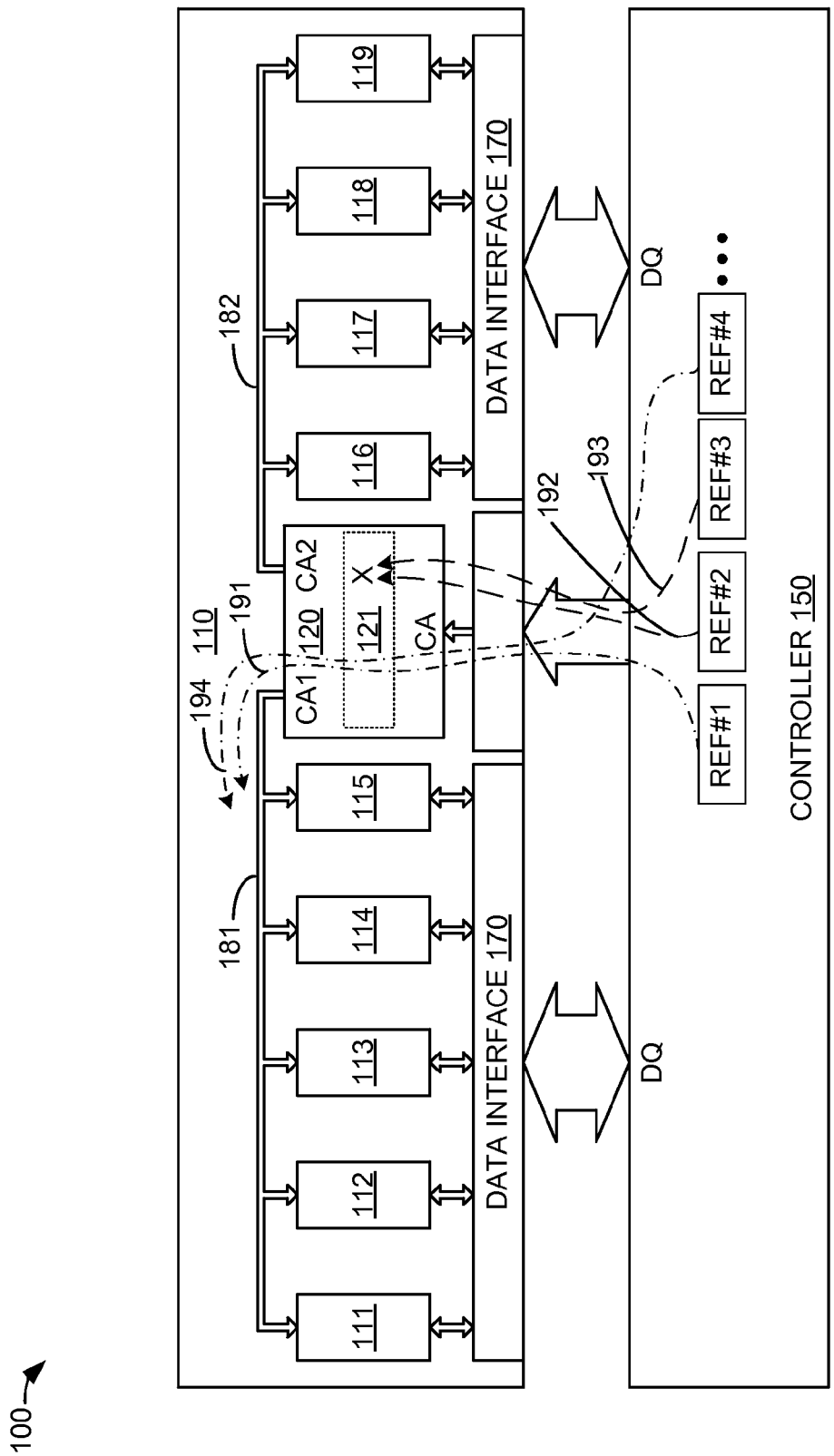
FIG. 1B is a diagram illustrating refresh commands sent to a memory component.

FIG. 1B is a diagram illustrating refresh commands sent to a memory component. In particular, FIG. 1B illustrates the suppression of (i.e., ignoring of) auto-refresh commands according to filter 121. In FIG. 1B, controller 150 sends auto-refresh (REF) commands #1, #2, #3, and #4 to module 110. This is illustrated in FIG. 1B by arrows 191, 192, 193, and 194, respectively. Arrows (with dash-dot lines) 191 and 194 run from REF #1 and REF #4, respectively, in controller 150 through buffer 120 to secondary CA bus 181. Thus, arrows 191 and 194 illustrate unsuppressed auto-refresh commands REF #1 and REF #4. Arrows (with dashed lines) 192 and 193 run from REF #2 and REF #3, respectively, in controller 150 to buffer 120 but terminate in filter 121. Thus, arrows 192 and 193 illustrate the suppression of auto-refresh commands REF #2 and REF #3 by buffer 120. It should be understood that FIG. 1B illustrates an example where buffer 120 has been configured to ignore N=2 of every M=3 auto-refresh commands.

In an embodiment, buffer 120 receives auto-refresh commands from controller 150 via CA interface 180. Buffer 120 may select N out of every M (where N and/or M are programmable integers) auto-refresh commands to suppress. In other words, not relaying the selected auto-refresh commands to one or both of secondary command-address bus (CA1) 181 and secondary command-address bus (CA2) 182—and also thereby not relaying the selected auto-refresh commands to memory components 111-115 and memory components 116-119, respectively. It should be understood that since the auto-refresh addresses are generated internally to memory components 111-119, the suppression of some (e.g., N of M) auto-refresh commands by buffer 120 does not result in some rows of memory components 111-119 not being periodically refreshed. Rather, the suppression of auto-refresh commands by buffer 120 results in a change in the interval between refresh operations that are performed on any given row of a memory components 111-119.

For example, buffer 120 could be programmed with N=1 and M=3. In other words, buffer 120 could be configured to ignore 1 out of every 3 auto-refresh commands. If controller 150 was issuing 8192 auto-refresh command to module 110 every 64 mS, the effective refresh interval from memory components 111-119 would experience would increase from 64 mS without any auto-refresh command suppression to 96 mS (i.e., with an N=1/M=3 filter, controller 150 would have to issue 12,288 auto-refresh commands for the memory components behind the buffer to see the nominal 8192 of them). Thus, programming buffer 120 to ignore 1 out of every 3 auto-refresh commands can reduce the overall refresh power by 33%. In addition, if advanced error-mitigation techniques are employed by controller 150 or buffer 120, overall system reliability can be maintained.

In an embodiment, buffer 120 and/or controller 150 may maintain a repair map and/or redundant storage. This redundant storage may be used to replace storage locations (e.g., bits, bytes, words, rows, etc.) that require the specified (e.g., 64 mS) refresh interval. The storage locations that require the specified refresh interval may be found during, for example, production testing of module 110 and/or memory components 111-119.

In an embodiment, buffer 120 may maintain additional filters 121. These additional filters 121 may be used, for example, to set different N of M ratios for different ranks or groups of memory components 111-119 on module 110. For example, a first filter 121 may set the auto-refresh suppression rate for the memory components 111-115 that receive commands via secondary CA bus 181. A second filter 121 (not shown in FIG. 1A) may set a different auto-refresh suppression rate for the memory components 116-119 that receive commands via secondary CA bus 182. Likewise, if module 110 has multiple ranks of memory components 111-119, additional filters (not shown in FIG. 1A) may set different auto-refresh suppression rates for each rank.

In an embodiment, memory module 110 include CA interface 180 to receive auto-refresh commands (among other commands/addresses.) These auto-refresh commands include at least a first auto-refresh command and a second auto refresh command. Memory module 110 also includes at least one memory component 111-119 and buffer 120. Buffer 120 is operatively coupled to CA interface 180 to receive the auto-refresh commands via CA interface 180. Buffer 120 is also operatively coupled to the at least one memory component 111-119. For example, buffer 120 may be operatively coupled to one or more of memory components 111-119 via secondary CA bus 181 and/or secondary CA bus 182. Buffer 120 sends the first auto-refresh command to the at least one memory component 111-119. Buffer 120 does not send the second auto-refresh command to the at least one memory component 111-119 (i.e., buffer 120 suppresses the second auto-refresh command.)

Buffer 120 can select auto-refresh commands received by buffer 120 for suppression. Buffer 120 can select a proportions (e.g., N of M) auto-refresh commands received by buffer 120 for suppression. Buffer 120 can select a proportion (e.g., N of M) auto-refresh commands received by buffer 120 for suppression where N and/or M are configurable.

In an embodiment, module 110 includes multiple ranks of memory components 111-119. Buffer 120 may be configurable to select, for each rank, different proportions of the auto-refresh commands to be suppressed (e.g., $N_1$ of $M_1$ for rank #1, $N_2$ of $M_2$ for rank #2, etc.—where one or more of the ratios $N_1/M_1$ and $N_2/M_2$ are not equal.)

In an embodiment, memory components 111-119 may provide feedback (e.g., via a status register or serial interface) to buffer 120 and/or controller 150. For example, one or more of memory components 111-119 may report a die temperature or a storage error rate. This feedback may be used by buffer 120 and/or controller 150 to adjust N and M.

Figure 2:
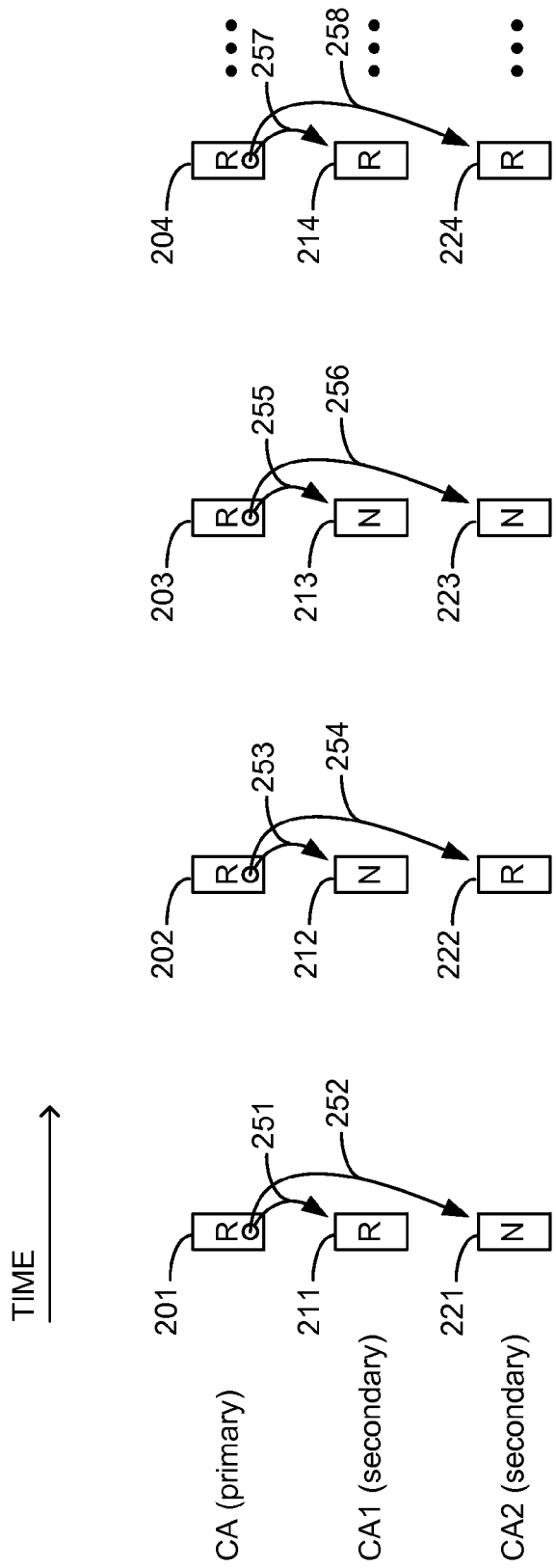
FIG. 2 is a timing diagram illustrating suppressed and unsuppressed refresh commands.

FIG. 2 is a timing diagram illustrating suppressed and unsuppressed refresh commands. In FIG. 2, auto-refresh commands 201-204 are illustrated as being issued on a primary command-address bus (e.g., CA bus 180). Auto-refresh commands 201-204 are illustrated as being distributed in time (i.e., auto-refresh commands 201-204 have some time intervals between them and are not shown as a contiguous burst). Commands corresponding to auto-refresh commands 201-204 are shown being issued on two secondary command-address busses (CA1 and CA2). The correspondence between auto-refresh commands 201-204 to the commands issued on CA1 is shown by arrows 251, 253, 255, and 257. The correspondence between auto-refresh commands 201-204 to the commands issued on CA2 is shown by arrows 252, 254, 256, and 258.

In FIG. 2, auto-refresh command 201 is shown being issued on (or received via) primary CA bus. As a result of auto-refresh command 201, a corresponding auto-refresh command 211 is issued on CA1 (shown by arrow 251) and a corresponding no-operation (NOP) command 221 is issued on CA2 (shown by arrow 252). In other words, auto-refresh command 201 was not suppressed (e.g., by buffer 120) on Ca1 but was suppressed (e.g., by buffer 120) before relay to CA2. Also, corresponding auto-refresh command 211 and corresponding NOP command 221 are issued in the communication interval (a.k.a. time slot), on the respective secondary busses CA1 and CA2, associated with auto-refresh command 201.

Auto-refresh command 202 is shown being issued on (or received via) primary CA bus. As a result of auto-refresh command 202, a corresponding NOP command 212 is issued on Ca1 (shown by arrow 253) and a corresponding auto-refresh command 222 is issued on CA2 (shown by arrow 254). In other words, auto-refresh command 201 was suppressed on CA1, but was not suppressed before relay to CA2. Also, corresponding NOP command 212 and corresponding auto-refresh command 222 are issued in the communication interval associated with auto-refresh command 202.

Auto-refresh command 203 is shown being issued on (or received via) primary CA bus. As a result of auto-refresh command 203, a corresponding NOP command 213 is issued on CA1 (shown by arrow 255) and a corresponding NOP command 223 is issued on CA2 (shown by arrow 256). In other words, auto-refresh command 203 was suppressed on both CA1 and CA2. Auto-refresh command 204 is shown being issued on (or received via) primary CA bus. As a result of auto-refresh command 204, a corresponding auto-refresh command 214 is issued on Ca1 (shown by arrow 257) and a corresponding auto-refresh command 224 is issued on CA2 (shown by arrow 258). In other words, auto-refresh command 203 was suppressed on neither CA1 nor CA2. Note that in some embodiments, CA1 and CA2 are electrically the same bus, but logically multiplexed using, for example, chip-select signals to distinguish CA1 and CA2 traffic.

Figure 3:
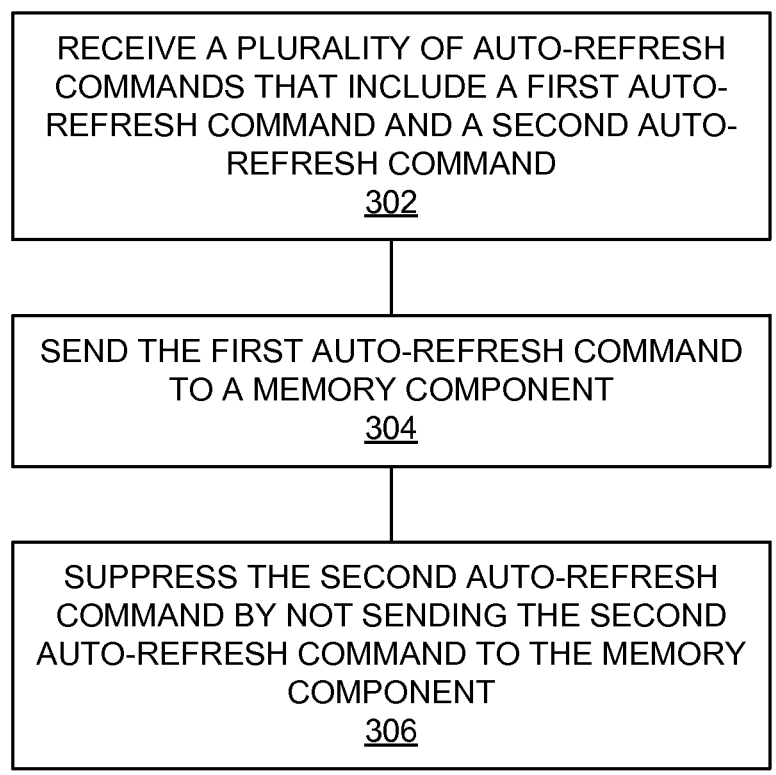
FIG. 3 is a flowchart of a method of refreshing a memory component.

FIG. 3 is a flowchart of a method of refreshing a memory component. The steps illustrated in FIG. 3 may be performed by one or more elements of memory system 100. A plurality of auto-refresh commands that include a first auto-refresh command and a second auto-refresh command are received (302). For example, buffer 120 may receive auto-refresh command 201 and auto-refresh command 202 from controller 150 via CA interface 180. The first auto-refresh command is sent to a memory component (304). For example, buffer 120 may send auto-refresh command 201 (e.g., as auto-refresh command 211) to memory component 111 via secondary CA bus 181.

The second auto-refresh command is suppressed by not sending the second auto-refresh command to the memory component (306). For example, buffer 120 may suppress auto-refresh command 202 by instead sending NOP command 212 to memory component 111 via CA bus 181.

Figure 4:
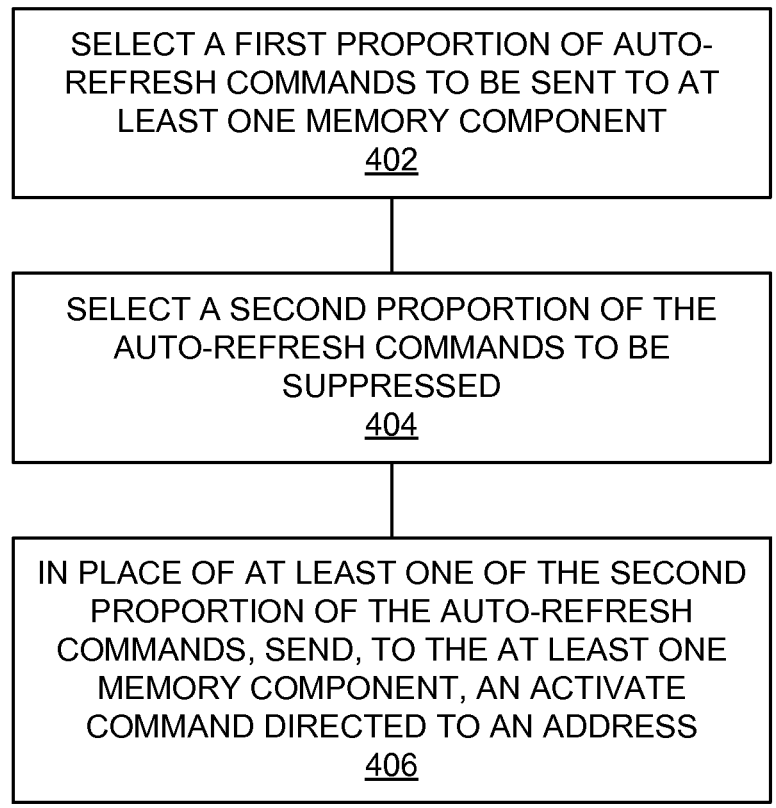
FIG. 4 is a flowchart of a method of performing directed refresh operations.

FIG. 4 is a flowchart of a method of performing directed refresh operations. The steps illustrated in FIG. 4 may be performed by one or more elements of memory system 100. A first proportion of auto-refresh commands are selected to be sent to at least one memory component (402). For example, buffer 120 may select "M-N" of "M" auto-refresh commands that buffer 120 receives via CA interface 180 to be relayed to memory components 111-119—where N and M can be integers and N<M. A second proportion of the auto-refresh commands (e.g., "N of M") are selected to be suppressed (404). For example, if N=1 and M=3, buffer 120 may select 1 of 3 auto-refresh commands buffer 120 receives via CA interface 180 to be suppressed, while allowing 2 of 3 auto-refresh commands to be relayed to the memory components.

In place of at least one of the second proportion of the auto-refresh commands, and to the at least one memory component, an activate command directed to an address is sent (406). For example, in place of one of the N of M auto-refresh commands that buffer 120 suppressed, buffer 120 may send an activate (ACT) command directed to a row in memory components 111-119. Buffer 120 may follow, after an appropriate delay, the activate command with a precharge (PRE) command directed to the address. This precharge command can also be sent during the time interval allocated to the suppressed auto-refresh command. The ACT-PRE combination may refresh the row in memory devices 111-119 associated with the address.

Figure 5:
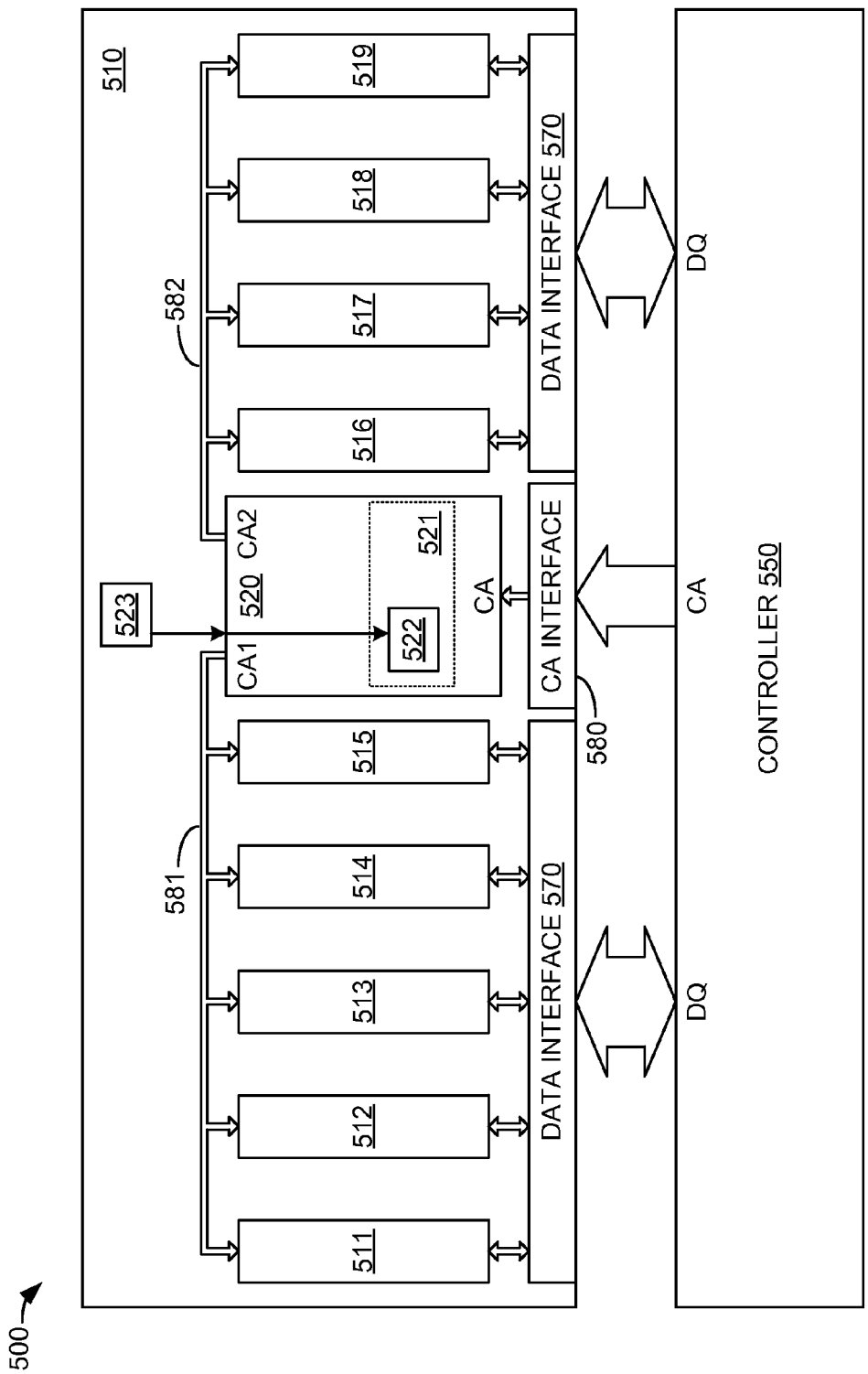
FIG. 5 is a block diagram of a memory system.

FIG. 5 is a block diagram of a memory system. In FIG. 5, memory system 500 comprises controller 550 and module 510. Controller 550 is operatively coupled to module 510 via data signals (DQ) and command-address signals (CA). Module 510 includes memory components 511-519, buffer 520, nonvolatile memory 523, data interface 570, and command-address interface 580. Command-address interface 580 is operatively coupled to buffer 520. Buffer 520 includes refresh control 521. Refresh control 521 includes row list storage 522. Buffer 520 is operatively coupled to memory components 511-515 via secondary command-address signals CA1 581. Buffer 520 is operatively coupled to memory components 516-519 via secondary command-address signals CA2 582. Nonvolatile memory 523 is operatively coupled to buffer 520, and row list storage 522 in particular. Buffer 520 may also be referred to as a CA Register. Thus, module 510 may be considered to be a registered module, or R-DIMM.

Controller 550 and memory components 511-519 may be integrated circuit type devices, such as are commonly referred to as a "chips". A memory controller, such as controller 550, manages the flow of data going to and from memory devices and/or memory modules. Memory components 511-519 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system, such as a block of a system on a chip (SOC).

Buffer 520 is operatively coupled to CA interface 580 and memory components 511-519 to reduce the electrical loading placed on the CA signals from controller 550. Buffer 520 helps isolate the electrical loading of the on-module DRAM memory components 511-519 from the command-address channel coupled to controller 550. Without buffer 520, the aggregate load of memory components 511-519 would degrade the achievable signaling rate of the command-address channel. In an embodiment, all command-address traffic sent between controller 550 and memory components 511-519 is first received by buffer 520 via CA interface 580.

Memory components 511-519 can use internal refresh address generation. In other words, the address for any given auto-refresh command received by a memory component 511-519 is generated internally to the respective memory component 511-514. Thus, the addresses for the auto-refresh commands are not supplied by controller 550. In an embodiment, the address signals received by CA interface 580 for an auto-refresh command are specified to be in a "don't care" state.

In an embodiment, buffer 520 includes refresh control 521. Refresh control 521 can be configured such that buffer 520 ignores selected auto-refresh commands. For example, filter 521 can be programmed such that buffer 520 ignores N out of every M auto-refresh commands. N and/or M, may be programmable (e.g., via a command on CA interface 580). Refresh control 521 can be programmed such that buffer 520 replaces selected auto-refresh commands with directed refresh commands (e.g., an ACT-PRE command pair directed to a selected row.)

Buffer 520 may receive auto-refresh commands from controller 150. For example, controller 520 may send auto-refresh commands to module 510 that average 7.8 uS intervals (e.g., 8192 auto-refresh commands every 64 mS). Buffer 520 may be configured allow M-N of M of these auto-refresh commands to be relayed to memory components 511-519 unmodified. Buffer 520 (and refresh control 521, in particular) may replace the remaining (i.e., N of M) auto-refresh commands with an activate command to a rank/bank/row address stored in row list storage 522. Row list storage 522 may receive addresses to be used by activate commands from nonvolatile memory 523.

In an example, controller 550 issues auto-refresh commands to module 510 at a rate that averages one burst of eight (8) auto-refresh commands (e.g., one refresh command for each of eight banks) every 7.8 uS per auto-refresh burst. Buffer 120 may be configured with N=9 and M=10. Thus, 1/10th of the auto-refresh commands are passed to memory components 511-519 unmodified. All or part of the remaining 9/10$^{th}$ of the auto-refresh commands are replaced by refresh control 521 with activate commands to rank/bank/row addresses stored in row list storage 522. This example configuration allows for all of the rows in module 510 to be auto-refreshed every 640 mS. It also allows for 8000 rows to receive directed refreshes at least every 64 mS. Accordingly, if the memory components 511-519 have less than 8000 rows that need refreshing every 64 mS, and the rest of the rows in memory components 511-519 can adequately retain data using a refresh interval 640 mS, this example configuration will maintain system reliability. By increasing the refresh interval for all but 8000 rows, the power consumed by module 510 to perform refresh operations is reduced when compared with a universal refresh interval of 64 mS for all rows.

In an embodiment, refresh control 521 counts the auto-refresh commands received by buffer 120 via CA interface 580. A proportion (e.g., M-N of M) of the auto-refresh commands are allowed by refresh control 521 to pass through buffer 520 to CA1 581 and/or CA2 582. Refresh control 521 may replace one or more of the remaining auto-refresh commands with directed refresh commands (i.e., ACT-PRE pairs to particular rank/bank/slice/row addresses). Row list storage 522 supplies the rank/bank/slice/row address for the directed refresh commands. Note that different directed refresh addresses can be sent during the same command interval, but on CA1 581 and CA2 582, respectively. In other words, during a given directed refresh, the ACT-PRE pair being sent on Ca1 581 may be directed to a different address than the ACT-PRE pair being sent on CA2 at the same time.

Row list storage 522 can be pre-programmed nonvolatile storage. Row list storage 522 can be filled using information stored in nonvolatile memory 523. For example, addresses stored in nonvolatile memory 523 can be copied to row list storage 522 using a private bus. In another example, addresses stored in nonvolatile memory 523 can be copied to row list storage 522 using a serial presence detect (SPD) interface. The refresh addresses stored in row list storage 522 may be determined by testing memory component 511-519 and/or testing module 510.

In an embodiment, memory module 510 includes CA interface 580 to receive auto-refresh commands sent by a memory controller 550. Module 510 also includes buffer 520 coupled to CA interface 580 to receive the auto-refresh commands. Buffer 520 suppresses a proportion of the received auto-refresh commands. Buffer 520 sends, via a secondary CA interface (CA1), and to memory components 511-515, at least one directed refresh command in a communication interval corresponding to a suppressed auto-refresh command. Buffer 520 also includes a second secondary command interface (CA2).

Buffer 520 can also send, via CA2, and to memory components 516-519, a directed refresh command in the same communication interval corresponding to the suppressed auto-refresh command. The directed refresh command sent via Ca1 and the directed refresh command sent to CA2 may have different addresses. These different addresses may comprise information that each specify a rank address, a bank address, and a row address. Note that in some embodiments, CA1 and CA2 are electrically the same bus, but logically multiplexed using, for example, chip-select signals to distinguish CA1 and CA2 traffic.

Buffer 520 may be configurable to set the proportion of received auto-refresh commands that are suppressed. Module 510 (and/or buffer 520) may include nonvolatile memory that supplies one or more addresses for directed refresh commands. This nonvolatile memory 523 may be external to buffer 520. Nonvolatile memory 523 may supply addresses for directed refresh commands to be sent via CA1 and supply (possibly different) addresses for directed refresh commands to be sent via CA2.

In an embodiment, memory components 511-519 may provide feedback (e.g., via a status register or serial interface) to buffer 520 and/or controller 550. For example, one or more of memory components 511-519 may report a die temperature, storage errors, storage error locations, and/or a storage error rate. This feedback may be used by buffer 520 and/or controller 550 to adjust N, M, and/or the contents of row list storage 522.

Figure 6:
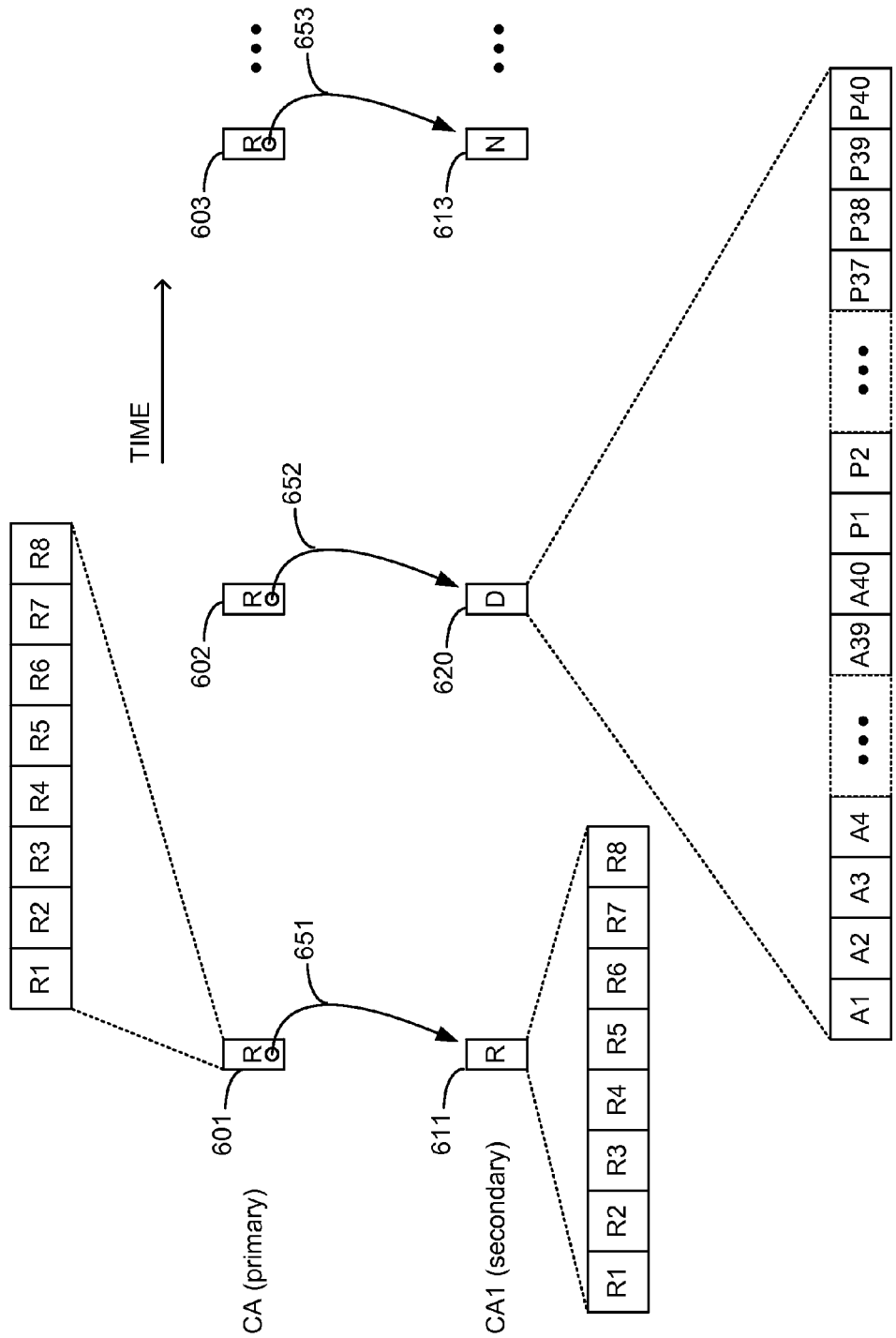
FIG. 6 is a timing diagram illustrating directed, suppressed, and unsuppressed refresh commands.

FIG. 6 is a timing diagram illustrating directed, suppressed, and unsuppressed refresh commands. Auto-refresh commands 601-603 are illustrated as being issued on a primary command-address bus (e.g., CA interface 180).

Auto-refresh commands 601-603 are illustrated as being distributed in time (i.e., auto-refresh commands 601-603 have time intervals between them and are not shown as a contiguous burst). Commands corresponding to auto-refresh commands 601-603 are shown being issued on a secondary command-address bus (CA1). The correspondence between auto-refresh commands 601-603 to the commands issued on CA1 is shown by arrows 651, 652, and 653.

In FIG. 6, auto-refresh command 601 is shown being issued on (or received via) primary CA bus. Auto-refresh command 601 includes eight auto-refresh operations R1-R8 (e.g., one auto-refresh operation for each of eight banks of memory components 511-515.) As a result of auto-refresh command 601, a corresponding auto-refresh command 611 is issued on Ca1 (shown by arrow 651.) Auto-refresh command 611 also includes eight auto-refresh operations R1-R8. In other words, auto-refresh command 601 was not suppressed (e.g., by buffer 120) on CA1. Also shown is that auto-refresh command 611 is issued in the communication interval (a.k.a. time slot) on CA1 that corresponds to auto-refresh command 601.

Auto-refresh command 602 is shown being issued on (or received via) primary CA bus. Auto-refresh command 602 would also include eight auto-refresh operations (e.g., R1-R8—not shown in FIG. 6.) As a result of auto-refresh command 602, corresponding directed refresh commands 620 are issued on CA1 (shown by arrow 652.) Directed refresh commands 620 is illustrated in FIG. 6 as including forty (40) activate commands (A1-A40), each to a different row address, and forty precharge commands (P1-P40) to close the activated rows. The ACT-PRE pairs refresh the addressed rows and then close the opened rows so that they may be accessed by other commands.

Auto-refresh command 603 is shown being issued on (or received via) primary CA bus. As a result of auto-refresh command 603, a corresponding NOP command 613 is issued on Ca1 (shown by arrow 255.) In other words, auto-refresh command 603 was suppressed on CA1.

Figure 7:
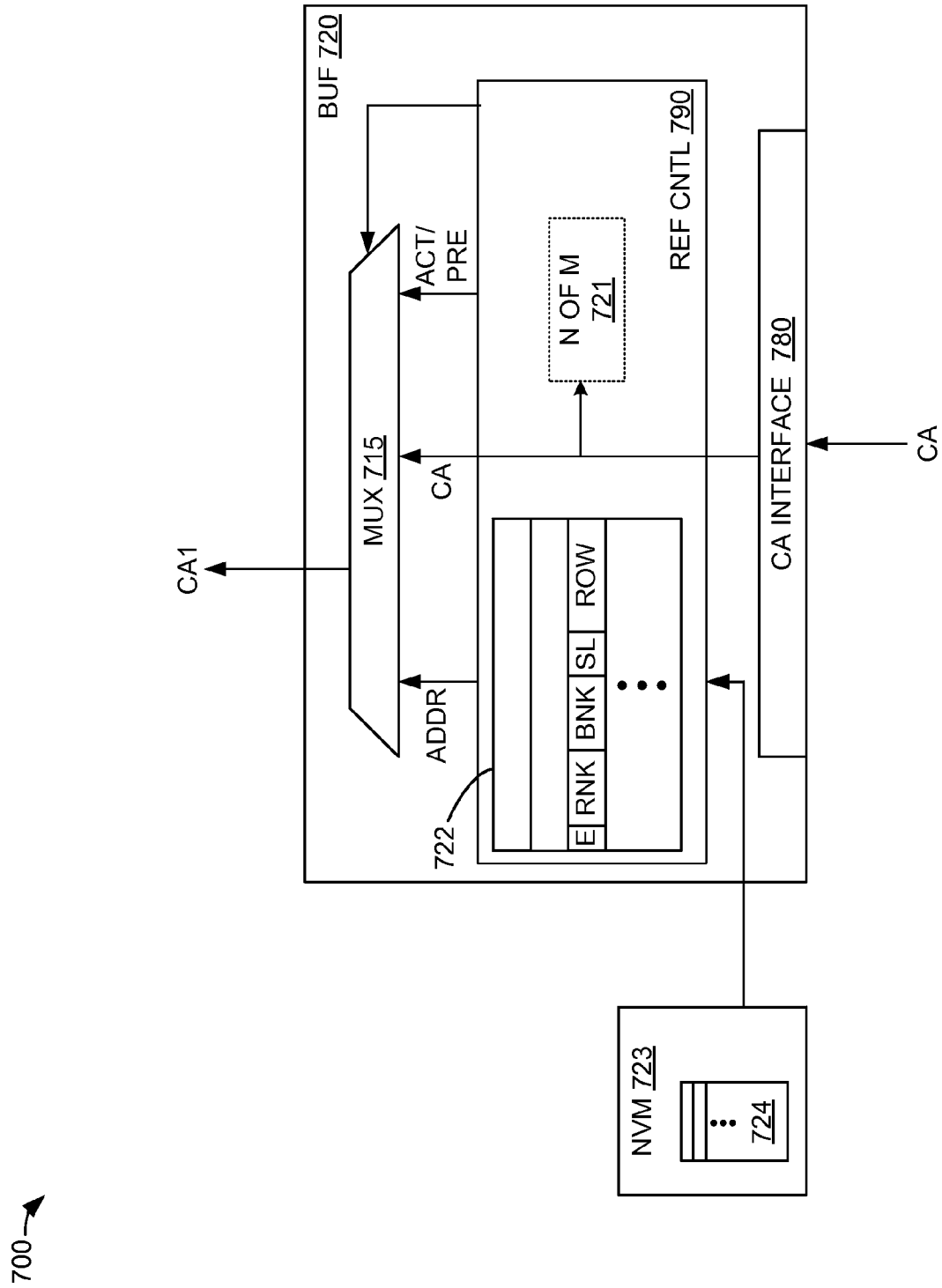
FIG. 7 is a block diagram of a memory module command/address buffer chip's subsystem.

FIG. 7 is a block diagram of a memory module command/address buffer chip's subsystem. In FIG. 7, subsystem 700 comprises nonvolatile memory 723 and buffer 720. Nonvolatile memory 723 can store addresses 724. Buffer 720 includes command-address interface 780, refresh control 790 and mux 715. Refresh control 790 includes row list buffer 722 and filter 721. Buffer 720 can receive commands from a primary CA interface (CA) and relay them to a secondary CA interface (CA1) unmodified, suppress them (i.e., replace with NOP commands), or replace them with one or more directed refresh commands (i.e., ACT-PRE pairs) to addresses stored in row list buffer 722.

Refresh control 790 counts the auto-refresh commands received by buffer 720 via CA interface 780. A proportion (e.g., M-N of M) of the auto-refresh commands are allowed by refresh control 790 to pass through buffer 720 to CA1 581 unmodified. Refresh control 790 may replace one or more of the remaining (e.g., N of M) auto-refresh commands with directed refresh commands (i.e., ACT-PRE pairs to particular rank/bank/slice/row addresses) by controlling the select input of mux 715. The output of mux 715 is supplied to the secondary command-address bus CA1. Row list buffer 722 supplies, to MUX 715, the rank/bank/slice/row address for the directed refresh commands to be selected at the appropriate time slot by refresh control 720.

Row list buffer 722 can be filled using addresses 724 stored in nonvolatile memory 723. For example, addresses 724 stored in nonvolatile memory 723 can be copied to row list storage 722 using a private bus. In another example, addresses 724 stored in nonvolatile memory 723 can be copied to row list storage 722 using a serial presence detect (SPD) interface. The refresh addresses stored in row list storage 722 may be determined by memory component testing and/or module testing.

Figure 8:
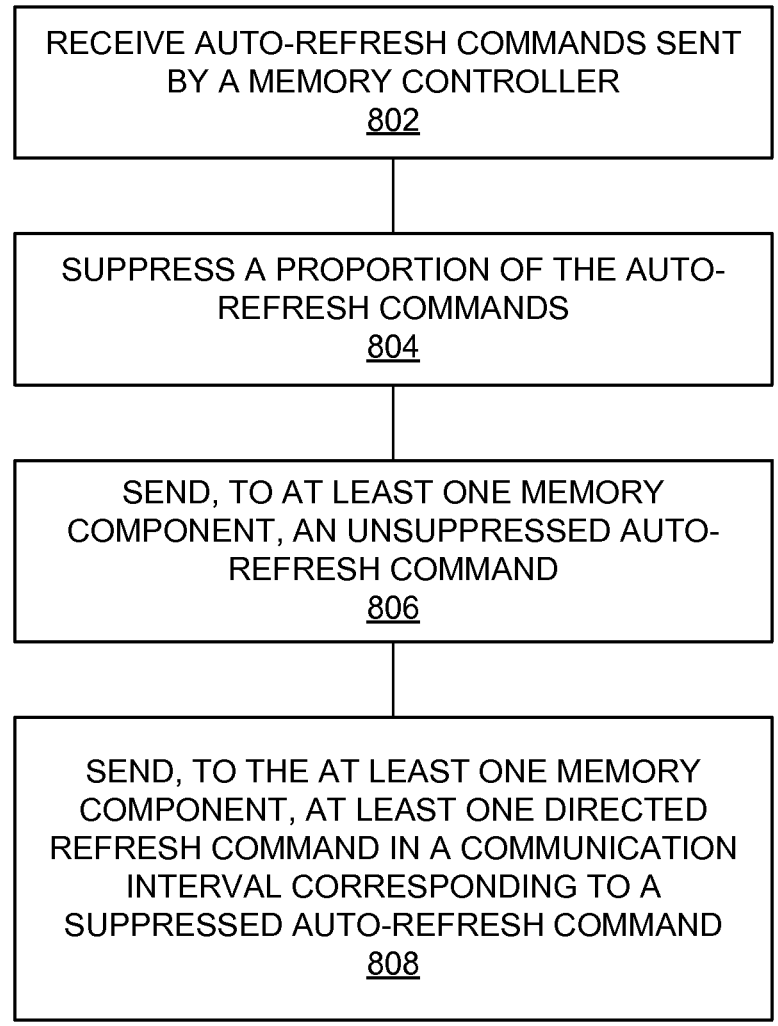
FIG. 8 is a flowchart of a method of selectively performing directed refresh operations.

FIG. 8 is a flowchart of a method of selectively performing directed refresh operations. The steps illustrated in FIG. 8 may be performed by one or more elements of memory system 100, memory system 500, and/or subsystem 700. Auto-refresh commands sent by a memory controller are received (802). For example, buffer 520 may receive auto-refresh commands from controller 550. A proportion of the auto-refresh commands are suppressed (804). For example, a proportion (e.g., N of M) the auto-refresh commands received by buffer 520 from controller 550, and intended for memory components 511-519, may be replaced with NOP commands that are sent to memory components 511-519.

To at least one memory component, an unsuppressed auto-refresh command is sent (806). For example, a proportion (e.g., M-N of M) of the auto-refresh commands received by buffer 520 from controller 550 may be relayed to the intended target of the auto-refresh commands—memory components 511-519.

To the at least one memory component, at least one directed refresh command is sent in a communication interval corresponding to a suppressed auto-refresh command (808). For example, buffer 520 may send a directed refresh command to memory components 511-519 in place of a suppressed auto-refresh command. Buffer 520 may send a plurality of directed refresh commands to memory components 511-519 in place of a suppressed auto-refresh command.

Figure 9:
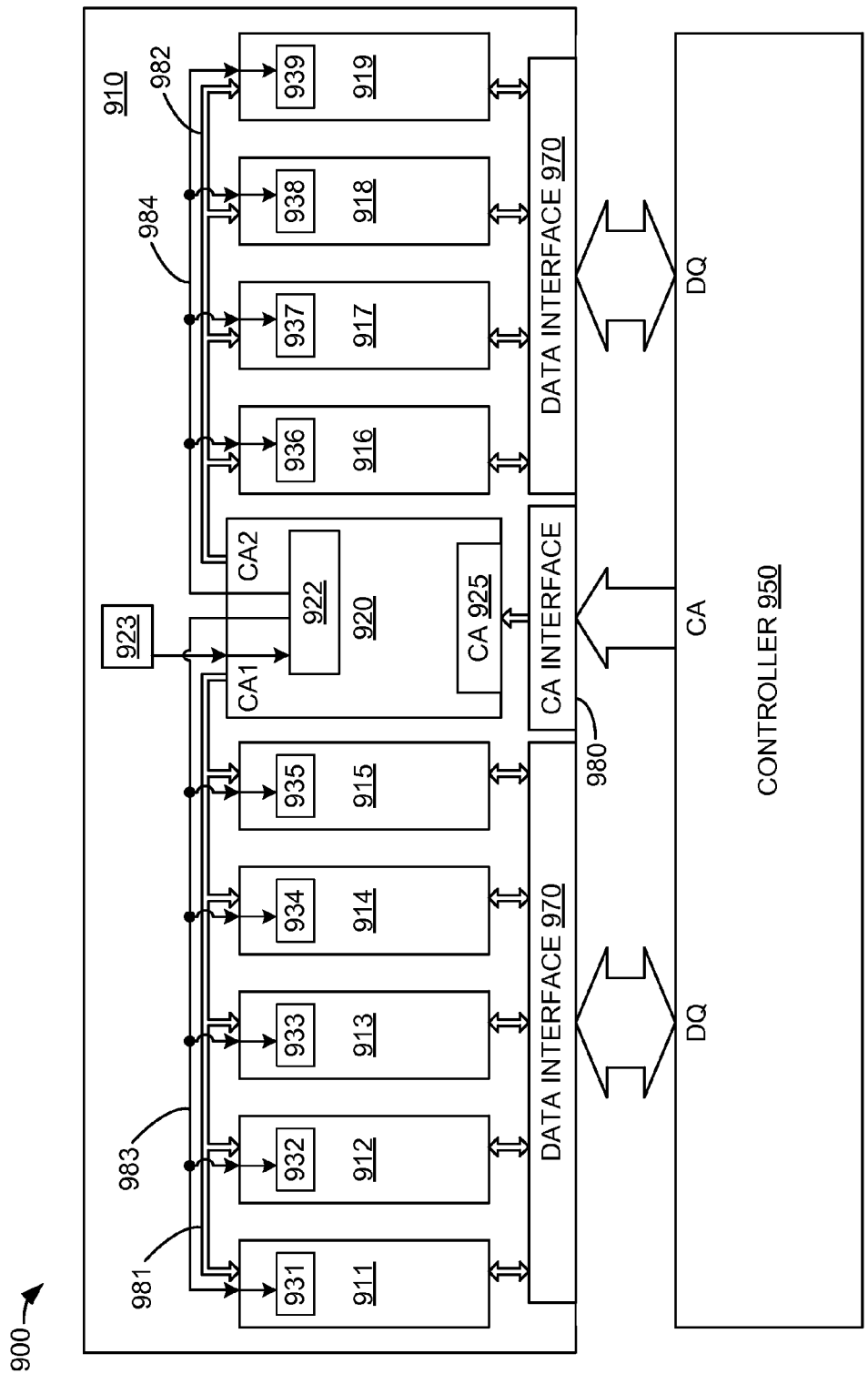
FIG. 9 is a block diagram of a memory system.

FIG. 9 is a block diagram of a memory system. In FIG. 9, memory system 900 comprises controller 950 and module 910. Controller 950 is operatively coupled to module 910 via data signals (DQ) and command-address signals (CA). Module 910 includes memory components 911-919, buffer 920, nonvolatile memory 923, data interface 970, and command-address interface 980. Buffer 920 includes row list storage 922 and CA interface 925. Command-address interface 980 is operatively coupled to CA interface 925 of buffer 920. Buffer 920 is operatively coupled to memory components 911-915 via secondary command-address bus CA1 981. Buffer 920 is operatively coupled to memory components 916-919 via secondary command-address bus CA2 982. Buffer 920 is operatively coupled to memory components 911-915 via row list interface 983. Buffer 920 is operatively coupled to memory components 916-919 via row list interface 984. Nonvolatile memory 923 is operatively coupled to buffer 920, and row list storage 922 in particular. Buffer 920 may also be referred to as a CA Register. Thus, module 910 may be considered to be a registered module, or R-DIMM.

Controller 950 and memory components 911-919 may be integrated circuit type devices, such as are commonly referred to as a "chips". A memory controller, such as controller 950, manages the flow of data going to and from memory devices and/or memory modules. Memory components 911-919 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system, such as a block of a system on a chip (SOC).

Buffer 920 is operatively coupled to CA interface 980 and memory components 911-919 to reduce the electrical loading placed on the CA signals from controller 950. Memory components 911-919 include row list buffers 931-939, respectively. Buffer 920 helps isolate the electrical loading of the on-module DRAM memory components 911-919 from the command-address channel coupled to controller 950. In an embodiment, all command-address traffic sent between controller 950 and memory components 911-919 is first received by buffer 920 via CA interface 980 and CA interface 925.

In an embodiment, row list interface 983 and row list interface 984 each comprise a timing reference signal and a data signal (e.g., CR and DR.) The timing reference signal can be used as a source-synchronous timing reference to communicate data on the data signal to memory components 911-919. In particular, row list interface 983 and row list interface 984 may be used to communicate addresses to memory components 911-919. These addresses may be stored in respective row list buffers 931-939. The addresses stored in row list buffers 931-939 may be used by memory components 911-919 for directed refresh operations. Because the timing reference signals of row list interface 983 and row list interface 984 are provided by controller 950, the timing reference signals of row list interface 983 and row list interface 984 may also be used to synchronize self-refresh operations to a clock domain provided by controller 950. By synchronizing self-refresh operations to a clock domain provided by controller 950 (i.e., the row list interface timing reference signal is mesosynchronous with the clock signal used when CA interface 925 is active), the transition between self-refresh operation and auto-refresh operation can be accomplished rapidly.

Memory components 911-919 can use internal refresh address generation. In other words, the address for any given auto-refresh command received by a memory component 911-919 is generated internally to the respective memory component 911-914. Thus, the addresses for the auto-refresh commands are not supplied by controller 950. In an embodiment, the address signals received by CA interface 925 for an auto-refresh command are specified to be in a "don't care" state. Memory components 911-919 can also self-refresh. That is, memory components 911-919 can internally generate self-refresh events (indicators) without receiving them from memory controller 950. These self-refresh events can cause a respective memory component 911-919 to perform sequential refresh operations. In an embodiment, memory components 911-919 can also perform directed refresh operations in response to the internally generated self-refresh events. In an embodiment, the self-refresh events can be generated from a temperature compensated event generator (e.g., oscillator or ring oscillator).

In an embodiment, both self-refresh operations and the auto-refresh operations are performed in response to the self-refresh event indicators. Since each memory component 911-919 generates its own self-refresh events, the interval between refresh operations (both auto- and self-refresh) is temperature compensated individually for each memory component 911-919. Each memory component 911-919 can be configured to select a proportion (e.g., P of Q) of the self-refresh events to be used to perform directed refresh operations (as opposed to sequential self-refresh operations.) The proportion of self-refresh events converted from sequential self-refresh operation to directed refresh operations may be configurable (i.e., P and Q may be programmable.)

In an embodiment, in a first mode, CA interface 925 is operating and controller 950 is supplying auto-refresh commands (and a timing reference signal—CK) to module 910 via CA interface 980. These auto-refresh commands are relayed to memory components 911-919 via secondary CA bus 981 and secondary CA bus 982, as appropriate. In response to a self-refresh event, a memory component 911-919 waits for the next auto-refresh command from controller 950, and performs the selected (i.e., either directed or sequential—as determined by the P of Q filter) refresh operations in the time slots corresponding to the auto-refresh command received from controller 950.

In a second mode, CA interface 925 is disabled. Likewise, in this second mode, module 910 may be configured to ignore the signals on data interface 970. However, CA interface 980 (and therefore CA interface 925 of buffer 920) may still receive a timing reference signal CK from controller 950. Thus, CA interface 925 (and therefore memory components 911-919) are not receiving auto-refresh commands from controller 950. In this mode, however, in response to a self-refresh event and synchronized with timing provided by the row list interface (i.e., CR), a memory component 911-919 performs the selected (i.e., either directed or Sequential—as determined by the P of Q filter) refresh operation.

In response to internally generated self-refresh events, a memory component 911-919 may perform either self-refresh operations or directed refresh operations (i.e., operations equivalent to ACT-PRE pairs to a particular bank and row address). Row list buffers 931-939 supply the bank and row address for the directed refresh operations.

The row list buffers 931-939 can be pre-programmed nonvolatile storage. Row list buffers 931-939 can be filled using information stored in nonvolatile memory 923. For example, addresses stored in nonvolatile memory 923 can be copied, via buffer 920, to one or more row list buffers 931-939 using row list interface 983 or row list interface 984. The refresh addresses stored in a particular row list buffer 931-939 may be determined by memory component 911-919 testing and/or module 910 testing. In an embodiment, row list buffers 931-939 are, from time to time, refilled using row list interface 983 or row list interface 984. This reduces the amount of storage required to be provided by row list buffers 931-939.

In an embodiment, using the auto-refresh time slots to perform refresh operations that are in response to internally generated self-refresh events can be viewed as merging auto-refresh and self-refresh into a unified refresh operation. Unified refresh is performed continuously without regard to whether a memory component 911-919 is in a low power mode (i.e., whether CA interface 925 is disabled.) Row list interfaces 983 and 984 provide addresses that allow certain rows with weak cells to be refreshed using a shorter refresh time interval than other rows (as described herein.)

In an embodiment, when CA interface 925 is disabled (e.g., by inactivating a clock enable signal—CKE) secondary CA interface 981 and secondary CA interface 982 are also disabled. In this mode, the self-refresh events are synchronized to the timing reference CR supplied by the row list interface 983 or 984. In other words, refresh operations are performed by the row list interfaces 983 or 984.

When CA interface 925 is enabled (e.g., by activating a clock enable signal—CKE) secondary CA interface 981 and secondary CA interface 982 are also enabled. In this mode, the self-refresh events are synchronized to the timing domain provided by CA interface 925 and the refresh operations are performed in timing intervals (slots) corresponding to the auto-refresh operations received on CA interface 925 via CA interface 980.

In an embodiment, the timing domain provided by CA interface 925 and the timing domain by a row list interface 983 or 984 are mesosynchronous. Thus, there is an upper bound on the phase difference between these two timing domains. Because there is an upper bound, and transitions between the two modes (e.g., CA interface 925 disabled and CA interface 925 enabled) are unlikely to coincide with a self-refresh event, the average transition time between the two modes is likely to be approximately the cycle time of CK.

In an embodiment, when CA interface 925 is enabled, memory components 911-919 may provide feedback (e.g., via a status register or serial interface) to buffer 920 and/or controller 950. For example, one or more of memory components 911-919 may report a die temperature, storage errors, storage error locations, and/or a storage error rate. This feedback may be used by buffer 920 and/or controller 950 to adjust N, M, and/or the contents of row list storage 923.

Figure 10A:
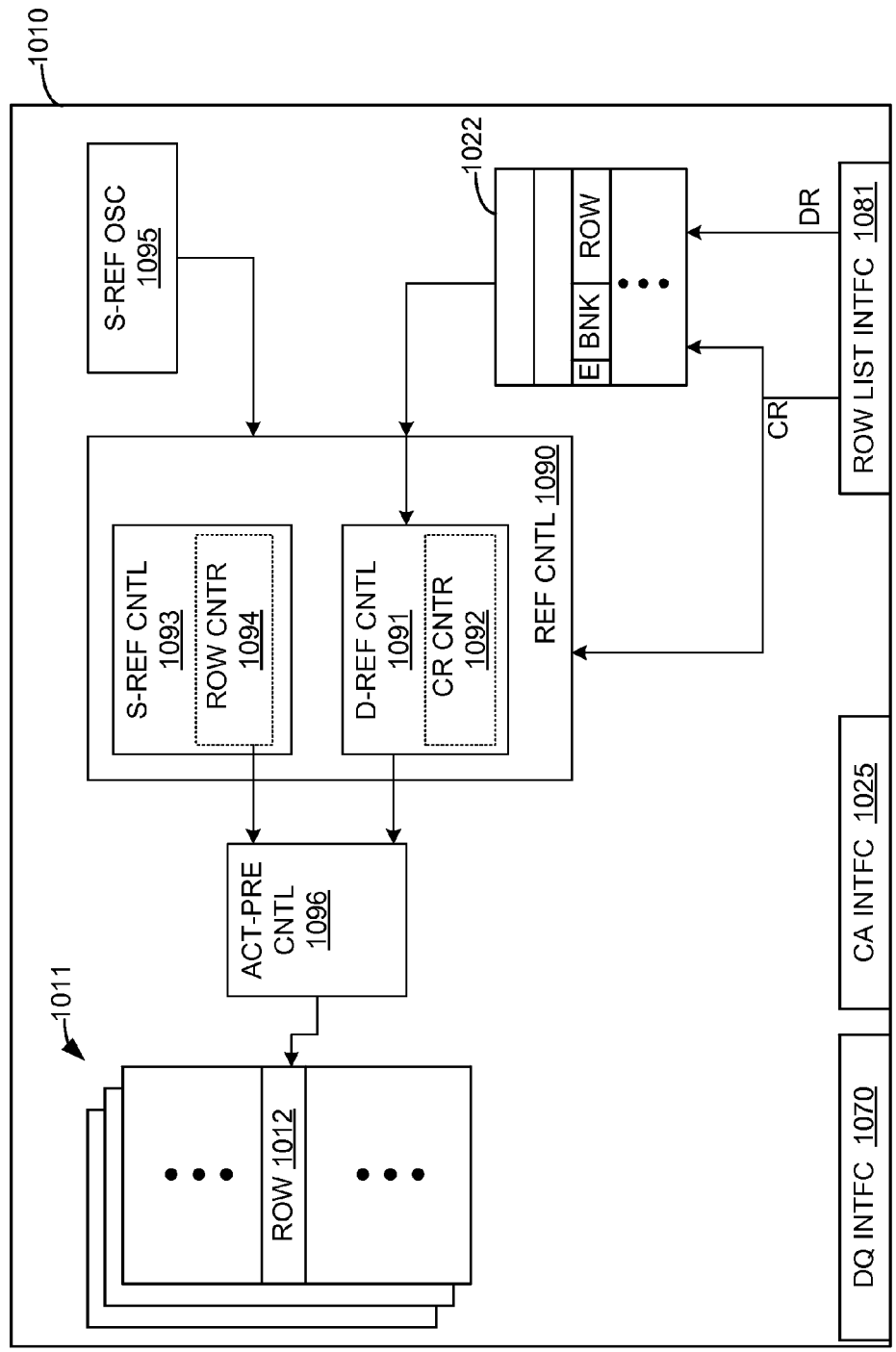
FIG. 10A is a block diagram of a memory component configured to perform directed and sequential self-refresh.

FIG. 10A is a block diagram of a memory component configured to perform directed and sequential self-refresh. FIG. 10A corresponds to a functional configuration (for refresh purposes) of a memory component 911-919 when CA interface 925 is disabled. In FIG. 10A, memory component 1010 comprises memory array 1011, row list buffer 1022, data (DQ) interface 1070, CA interface 1025, row list interface 1081, refresh control 1090, self-refresh oscillator 1095, and activate-precharge control 1096. Memory array 1011 includes row 1012. Refresh control 1090 includes self-refresh control 1093 and directed refresh control 1091. Self-refresh control 1094 includes row counter 1094. Directed refresh control 1091 includes row list interface timing reference (CR) counter 1092.

Row list interface 1081 is operatively coupled to row list buffer 1022. Row list interface 1081 is operatively coupled to row list buffer 1022 to provide row list buffer with addresses (bank and row) to be used for directed refresh operations. Row list interface 1081 is operatively coupled to refresh control 1090.

Row list interface 1081 is operatively coupled to refresh control 1090. Row list interface 1081 may be operatively coupled to refresh control 1090 to provide refresh control 1090 with row list counter timing reference CR. Self-refresh oscillator 1095 is operatively coupled to refresh control 1090. Self-refresh oscillator 1095 may be operatively coupled to refresh control 1090 to provide refresh control 1090 with self-refresh event indicators. Row list buffer 1022 is operatively coupled to refresh control 1090. Row list buffer 1022 may be operatively coupled to refresh control 1090 to provide bank and row addresses to refresh control 1090. The bank and row addresses provided to refresh control 1090 may be used to refresh rows (e.g., row 1012) associated with the provided addresses.

Refresh control 1090 is operatively coupled to activate-precharge control 1096. Activate-precharge control 1096 is operatively coupled to memory array 1011 to refresh rows (e.g., row 1012) in memory array 1011 by activating a respective row, and then precharging (deactivating) the respective row. Refresh control 1090, and self-refresh control 1093, in particular, is operatively coupled to activate-precharge control 1096 to provide activate-precharge control 1096 with a sequential self-refresh address (e.g., from row counter 1094) of a row that activate-precharge control 1096 is to refresh. Refresh control 1090, and directed refresh control 1091 in particular, are operatively coupled to activate-precharge control 1096 to provide activate-precharge control 1096 with a directed refresh address (e.g., from row list buffer 1022) of a row that activate-precharge control 1096 is to refresh. Directed refresh control 1091 includes CR counter 1092 to select when (i.e., which CR timing intervals) to perform directed refresh operations.

In the configuration illustrated in FIG. 10A, self-refresh oscillator 1010 generates self-refresh events (indicators) that specify when refresh operation is to occur. Refresh control 1090 receives these self-refresh events from self-refresh oscillator 1010. Refresh control 1090 also receives row list interface timing reference signal CR. In an example, CR may be ~2.5× the frequency that self-refresh oscillator 1010 generates self-refresh events.

Refresh control 1090 synchronizes self-refresh events to the CR timing reference. Refresh control 1090 synchronizes self-refresh events to the CR timing reference such that activate-precharge control waits to start a self-refresh burst until CR is in a certain state (e.g., transitions from low to high). Refresh control 1090 controls activate-precharge control 1096 such that directed refresh operations are interleaved with the self-refresh bursts. The interval between directed refresh operations may be determined by a rollover (or maximum) count as kept by CR counter 1092. Self-refresh operations and directed refresh operations may only be performed in response to a predetermined edge of CR.

Figure 10B:
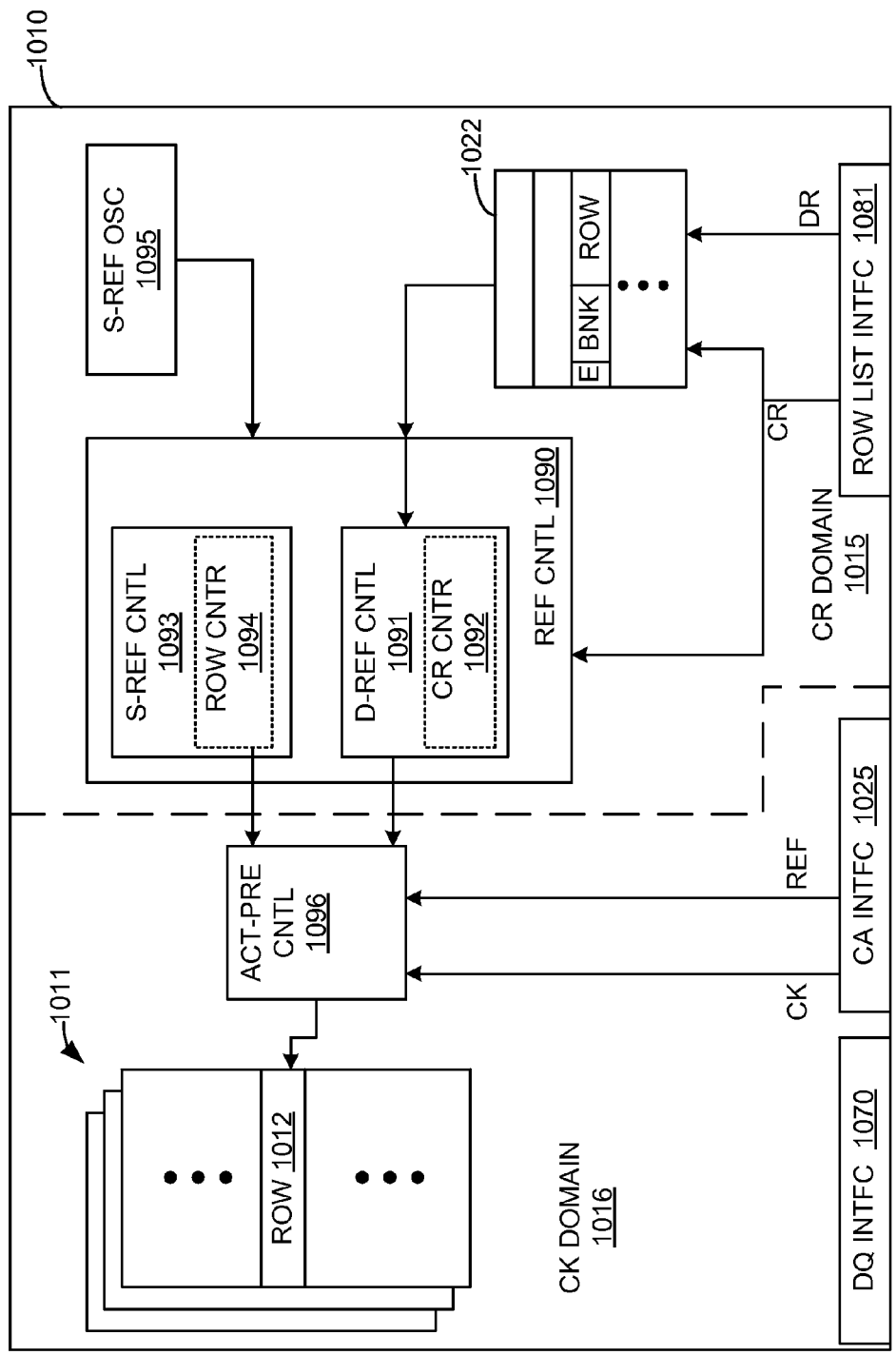
FIG. 10B is a block diagram of a memory component configured to perform directed and sequential self-refresh operations using auto-refresh time slots.

FIG. 10B is a block diagram of a memory component configured to perform directed and sequential self-refresh operations using auto-refresh time slots. FIG. 10A corresponds to a functional configuration (for refresh purposes) of a memory component 911-919 when CA interface 1025 is enabled. In FIG. 10B, like FIG. 10A, memory component 1010 comprises memory array 1011, row list buffer 1022, data (DQ) interface 1070, CA interface 1025, row list interface 1081, refresh control 1090, self-refresh oscillator 1095, and activate-precharge control 1096. In FIG. 10B, however, CA interface 1025 is operatively coupled to activate-precharge control 1096. CA interface 1025 is operatively coupled to activate-precharge control 1096 to provide a timing reference (CK) and auto-refresh commands (REF) to activate-precharge control 1096. In FIG. 10B, therefore, memory component 1010 comprises two clock domains—CR domain 1015 and CK domain 1016.

In the configuration illustrated in FIG. 10B, self-refresh oscillator 1010 generates self-refresh events (indicators) that specify when a refresh operation is to occur. Refresh control 1090 receives these self-refresh events from self-refresh oscillator 1010. Refresh control also receives row list interface timing reference signal CR.

Refresh control 1090 synchronizes self-refresh events to the CR timing reference. Refresh control 1090 synchronizes self-refresh events to the CR timing reference such that activate-precharge control 1096 will wait to start a refresh burst (either sequential self-refresh to rows provided by self-refresh control 1093 or a directed refresh to rows provided by row list buffer 1022) until CR is in a certain state (e.g., transitions from low to high) and it is during a timing interval corresponding to an auto-refresh command received from CA interface 1025. Refresh control 1090 controls activate-precharge control 1096 such that directed refresh operations are interleaved with the self-refresh bursts. The interval between directed refresh operations may be determined by a rollover (or maximum) count as kept by CR counter 1092.

Self-refresh operations and directed refresh operations may only be performed in response to a predetermined edge of CR. In an embodiment, CR is synchronized to CK (e.g., by buffer 920.) In this case, the latency to exit from this mode will be a maximum of the specified self-refresh exit time (e.g., $t_{XS}$) and a minimum of the CK cycle time. Thus, during most of the CR cycle time (e.g., 3.88 uS), the exit time from this mode will be the CK cycle time (e.g., 10 nS)—which leads to an average exit time from this mode that is approximately the CK cycle time (e.g., 14 nS).

In an embodiment, row list buffer 1022 may be loaded once. Row list buffer 1022 may comprise static random access memory (SRAM). Row list buffer 1022 may comprise dynamic random access memory (DRAM). Row list buffer 1022 may comprise a mat (or ½ mat) of DRAM memory cells per bank of memory array 1101. Row list buffer 1022 may comprise spare rows from mats in memory array 1101.

At initialization, the SRAM or DRAM region may be loaded with the directed refresh address information. In an embodiment, the directed refresh address information can be provided via the CA and/or DQ buses. In an embodiment, the directed refresh address information can be provided via a row list interface signal DR. During self-refresh, the refresh control 1090 can load the row list buffer 1022 from larger SRAM (or DRAM) storage. For example, a dedicated SRAM array may hold the directed refresh address information. In another example, a region of DRAM is allocated to hold the directed refresh address information. In this case, the DRAM space for general storage in memory component 1010 is reduced. In another example, two half-mats of unused DRAM are available in each bank. These unused half-mats can be used to hold the directed refresh address information (perhaps augmented with error control.)

In another example, row list buffer 1022 is loaded via at least one DR signal on row list interface 1081 from non-volatile memory during self-refresh. In an embodiment, DR is synchronous with CR. For example, at 250 Kb/s, about 1K extra rows can be specified per refresh interval (e.g., 64 mS) per DR signal. At 250 Mb/s, about 1M extra rows can be specified per 64 mS refresh interval per DR signal.

Figure 11:
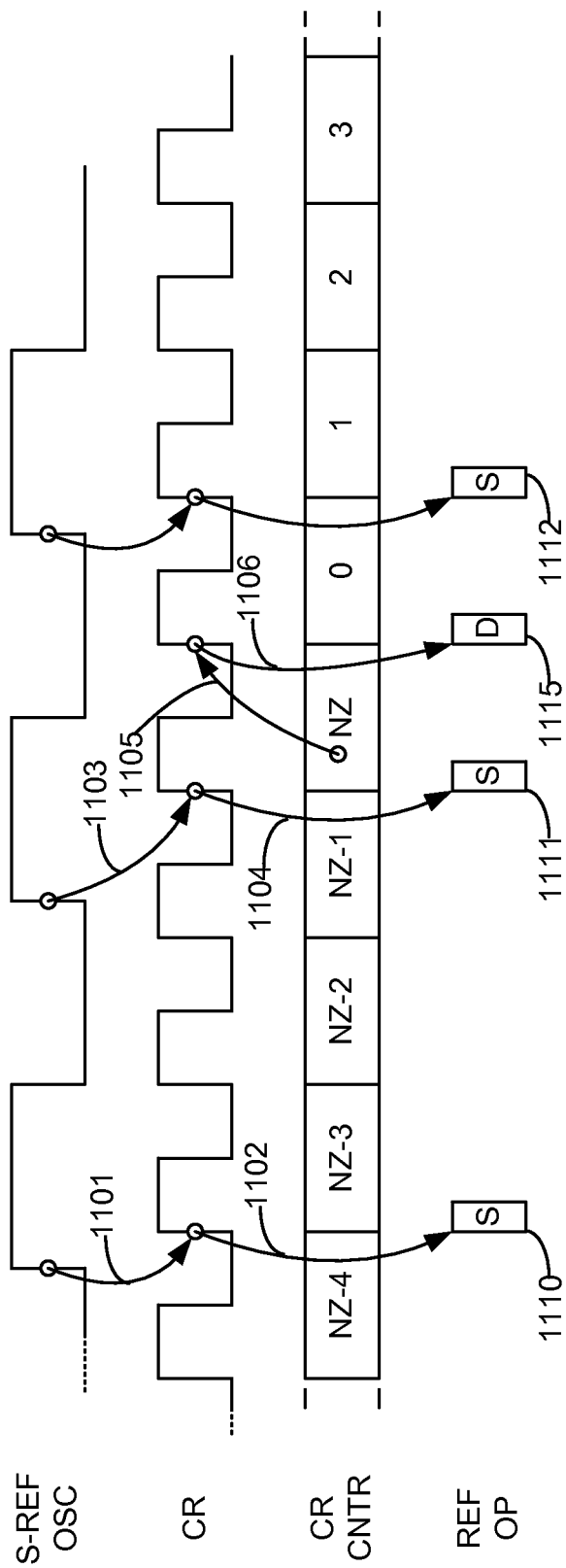
FIG. 11 is a diagram illustrating directed and sequential self-refresh timing.

FIG. 11 is a diagram illustrating directed and sequential self-refresh timing. Self-refresh oscillator events (e.g., rising edges) are illustrated occurring at periodic intervals. Likewise, row list interface timing reference (CR) events (e.g., rising edges) are illustrated occurring at periodic intervals. Example count states for row list timing reference counter (e.g., CR counter 1092) are illustrated and occur in response to CR events. Synchronization of self-refresh events to CR are illustrated by arrows 1101 and 1103. Refresh operations (e.g., sequential self-refresh operation and directed refresh operations performed by activate-precharge control 1096) are illustrated being performed in response to CR events by arrows 1102, 1104, and 1106. The state of CR counter (e.g. reaching a count of Nz) causing a directed refresh operation 1115 is illustrated by arrow 1105.

In FIG. 11, a self-refresh event occurs and is synchronized to CR (arrow 1101). In response to the self-refresh event, and synchronized to CR, a first sequential self-refresh operation 1110 is performed (arrow 1102). At a later time, a second a self-refresh event occurs and is synchronized to CR (arrow 1103). In response to the second self-refresh event, and synchronized to CR, a second sequential self-refresh operation 1111 is performed (arrow 1104). When CR counter reaches a predetermined threshold (or rollover count), the next CR event causes a directed refresh operation 1115 to be performed. This is illustrated in FIG. 11 by arrow 1105 and arrow 1106. Thus, it should be understood from FIG. 11 that directed refresh operations can be interleaved with sequential self-refresh operations. It should also be understood that if a sequential self-refresh operation (e.g., self-refresh operation 1111) and a directed refresh operation (e.g., directed refresh operation 1115) were to collide (e.g., be scheduled to be performed by the same CR event), the directed refresh operation could be rescheduled for the next CR event (or vice versa).

Figure 12:
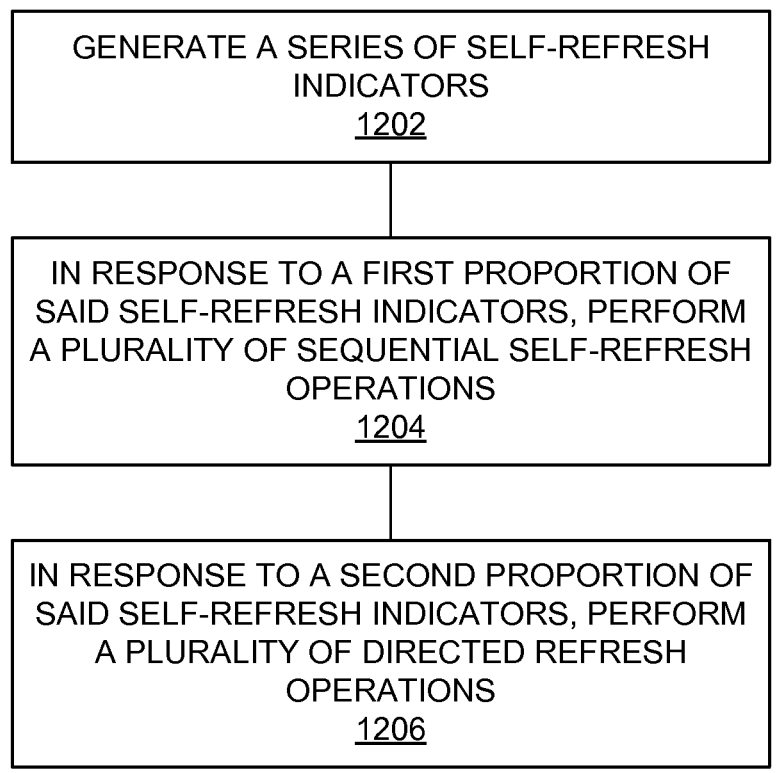
FIG. 12 is a flowchart illustrating a method of performing self-refresh operations.

FIG. 12 is a flowchart illustrating a method of performing self-refresh operations. The steps illustrated in FIG. 12 may be performed by one or more elements of memory system 100, memory system 500, subsystem 700, memory system 900, and/or memory component 1010. A series of self-refresh indicators are generated (1202). For example, self-refresh oscillator 1095 may generate a temperature compensated periodic signal that indicates a refresh interval. In response to a first proportion of the self-refresh indicators, a plurality of sequential self-refresh operations are performed (1204). For example, in response to P of Q (where P and Q are integers and Q≥P) self-refresh events received from self-refresh oscillator 1095, refresh control may instruct activate-precharge control 1096 to perform self-refresh bursts to refresh rows in memory array 1101.

In response to a second proportion of said self-refresh indicators, a plurality of directed refresh operations are performed (1206). For example, in response to Q-P of Q (where P and Q are integers and Q≥P) self-refresh events received from self-refresh oscillator 1095, refresh control 1090 may instruct activate-precharge control 1096 to perform refresh operations to refresh rows in memory array 1101 that are addressed by addresses stored in row list buffer 1022.

Figure 13:
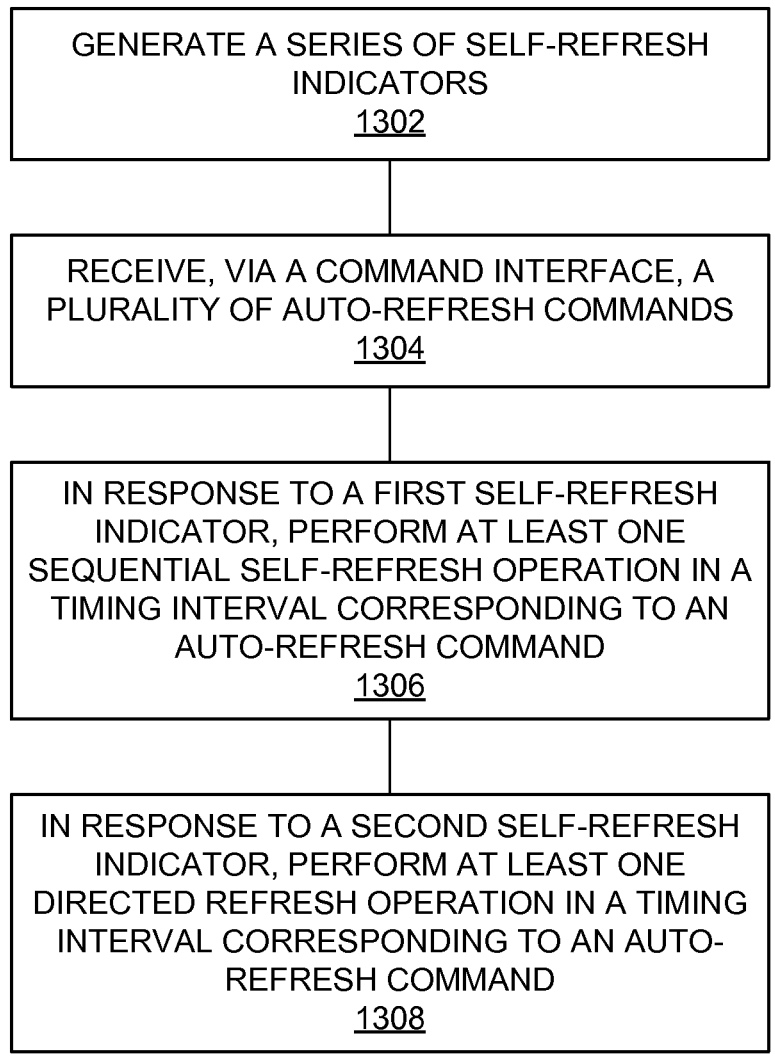
FIG. 13 is a flowchart illustrating a method of performing sequential and directed self-refresh operations using auto-refresh time allocations.

FIG. 13 is a flowchart illustrating a method of performing sequential and directed self-refresh operations using auto-refresh time allocations. The steps illustrated in FIG. 13 may be performed by one or more elements of memory system 100, memory system 500, subsystem 700, memory system 900, and/or memory component 1010. A series of self-refresh indicators are generated (1302). For example, self-refresh oscillator 1095 may generate a temperature compensated periodic signal that indicates a refresh interval. Via a command interface, a plurality of auto-refresh commands are received (1304). For example, memory component 1010 may receive auto-refresh commands sent by a controller (e.g., controller 950). These auto-refresh commands may have been relayed by a buffer (e.g., buffer 920).

In response to a first self-refresh indicator, at least one sequential self-refresh operation is performed in a timing interval corresponding to an auto-refresh command (1306). For example, in response to one of the refresh interval indicators from self-refresh oscillator 1095, refresh control 1090 (and self-refresh control 1093, in particular) may control activate-precharge control 1096 perform a burst sequential self-refresh operations in a timing slot that corresponds to an auto-refresh command received via CA interface 1025 (and according to a timing reference provided via CA interface 1025.)

In response to a second self-refresh indicator, at least one directed self-refresh operation is performed in a timing interval corresponding to an auto-refresh command (1308). For example, in response to one of the refresh interval indicators from self-refresh oscillator 1095, refresh control 1090 (and directed refresh control 1091 in particular) may control activate-precharge control 1096 perform a refresh operation (e.g., ACT-PRE pair) in a timing slot that corresponds to an auto-refresh command received via CA interface 1025 (and according to a timing reference provided via CA interface 1025.)

Figure 14:
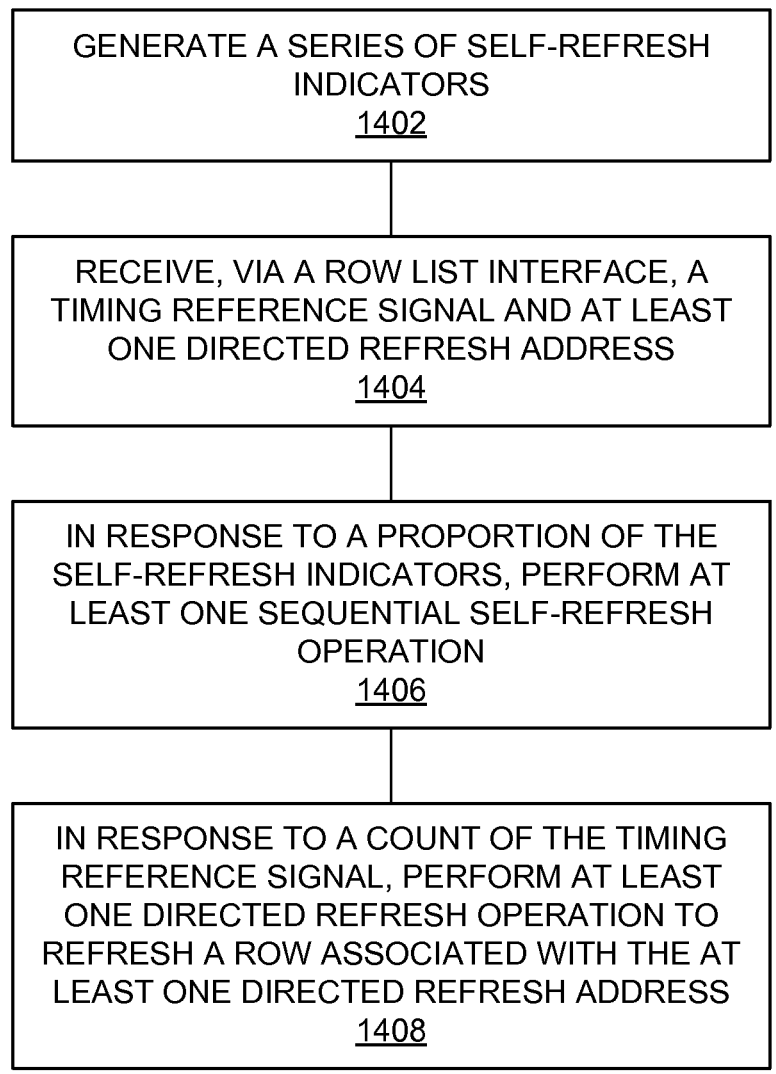
FIG. 14 is a flowchart illustrating a method of interleaving sequential and directed self-refresh operations.

FIG. 14 is a flowchart illustrating a method of interleaving sequential and directed self-refresh operations. The steps illustrated in FIG. 14 may be performed by one or more elements of memory system 100, memory system 500, subsystem 700, memory system 900, and/or memory component 1010. A series of self-refresh indicators are generated (1402). For example, self-refresh oscillator 1095 may generate a temperature compensated periodic signal that indicates a refresh interval. Via a row list interface, a timing reference signal and at least one directed refresh address are received (1404). For example, via row list interface 1081, memory component 1010 may receive from a buffer (e.g., buffer 920) a timing reference signal CR and a bank/row address (via DR).

In response to a proportion of the self-refresh indicators, at least one sequential self-refresh operation is performed (1406). For example, in response to P of Q (where P and Q are integers and Q≥P) self-refresh events received from self-refresh oscillator 1095, refresh control 1090 may instruct activate-precharge control 1096 to perform self-refresh bursts to refresh rows in memory array 1101.

In response to a count of the timing reference signal, at least one directed refresh operation to refresh a row associated with the at least one directed refresh operation is performed (1408). For example, when CR counter 1092 reaches a predetermined threshold (or rollover count), refresh control 1090 may instruct activate-precharge control 1096 to perform a directed refresh to refresh a row in memory array 1101 that is specified by the address received via the row list interface (and optionally stored in row list buffer 1022.)

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to, one or more elements of memory system 100, memory system 500, subsystem 700, memory system 900, and/or memory component 1010, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 15:
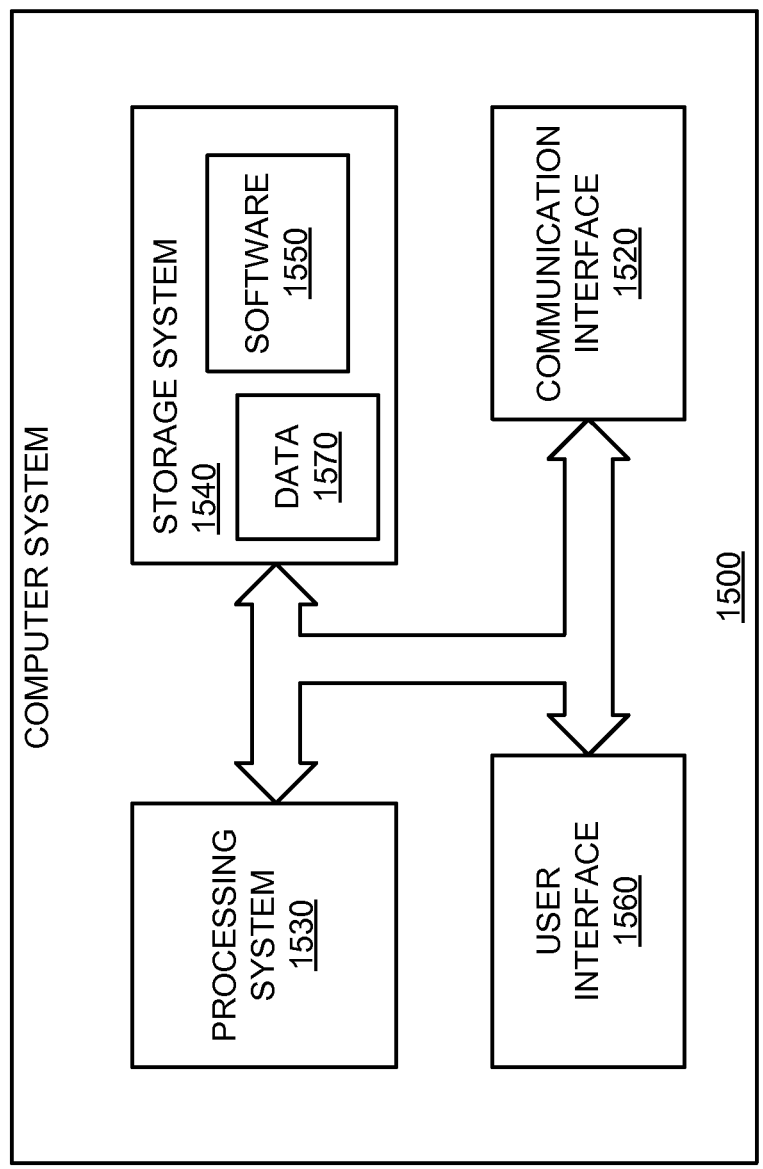
FIG. 15 is a block diagram of a computer system.

FIG. 15 illustrates a block diagram of a computer system. Computer system 1500 includes communication interface 1520, processing system 1530, storage system 1540, and user interface 1560. Processing system 1530 is operatively coupled to storage system 1540. Storage system 1540 stores software 1550 and data 1570. Computer system 1500 may include one or more of memory system 100, memory system 500, subsystem 700, memory system 900, and/or memory component 1010, or components that implement the methods, functions, processing, communication, circuits, and/or systems described herein. Processing system 1530 is operatively coupled to communication interface 1520 and user interface 1560. Computer system 1500 may comprise a programmed general-purpose computer. Computer system 1500 may include a microprocessor. Computer system 1500 may comprise programmable or special purpose circuitry. Computer system 1500 may be distributed among multiple devices, processors, storage, and/or interfaces that together comprise elements 1520-1570.

Communication interface 1520 may comprise a network interface, modem, port, bus, link, transceiver, or other communication device. Communication interface 1520 may be distributed among multiple communication devices. Processing system 1530 may comprise a microprocessor, microcontroller, logic circuit, or other processing device. Processing system 1530 may be distributed among multiple processing devices. User interface 1560 may comprise a keyboard, mouse, voice recognition interface, microphone and speakers, graphical display, touch screen, or other type of user interface device. User interface 1560 may be distributed among multiple interface devices. Storage system 1540 may comprise a disk, tape, integrated circuit, RAM, ROM, EEPROM, flash memory, network storage, server, or other memory function. Storage system 1540 may include computer readable medium. Storage system 1540 may be distributed among multiple memory devices.

Processing system 1530 retrieves and executes software 1550 from storage system 1540. Processing system 1530 may retrieve and store data 1570. Processing system 1530 may also retrieve and store data via communication interface 1520. Processing system 1530 may create or modify software 1550 or data 1570 to achieve a tangible result. Processing system 1530 may control communication interface 1520 or user interface 1560 to achieve a tangible result. Processing system 1530 may retrieve and execute remotely stored software via communication interface 1520.

Software 1550 and remotely stored software may comprise an operating system, utilities, drivers, networking software, and other software typically executed by a computer system. Software 1550 may comprise an application program, applet, firmware, or other form of machine-readable processing instructions typically executed by a computer system. When executed by processing system 1530, software 1550 or remotely stored software may direct computer system 1500 to operate.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory module, comprising:
   an interface to receive a plurality of auto-refresh commands, the plurality of auto-refresh commands including a first auto-refresh command and a second auto refresh command;
   at least one memory component; and,
   a buffer component coupled to the interface and coupled to the at least one memory component, the buffer component to receive the plurality of auto-refresh commands via the interface, the buffer component to, based on a configured proportion of received auto-refresh commands, send the first auto-refresh command to the at least one memory component, the buffer component to also, based on the configured proportion of received auto-refresh commands, not send the second auto-refresh command to the at least one memory component.

2. The module of claim 1, wherein the configured proportion is programmable.

3. The module of claim 1, wherein the at least one memory component includes a first rank comprising a first at least one memory component and a second rank comprising a second at least one memory component, the buffer component configurable to select a first configured proportion of the plurality of auto-refresh commands to not be sent to the first rank and configurable to select a second configured proportion of the plurality of auto-refresh commands to not be sent to the second rank, the first configured proportion and the second configured proportion configurable to be not equal.

4. The module of claim 1, wherein the buffer component is to select directed refresh proportion of the plurality of auto-refresh commands to not be sent to the at least one memory component, the buffer to send, to said at least one memory component and in place of said directed refresh proportion of said plurality of auto-refresh commands, an activate command to an address, said buffer component storing said address.

5. The module of claim 4, wherein said address comprises information that specifies a rank address, a bank address, and a row address.

6. The module of claim 4, wherein said module further comprises nonvolatile memory and said nonvolatile memory supplies said address for said activate command.

7. The module of claim 4, wherein said nonvolatile memory is external to said buffer component.

8. A buffer component, comprising:
a primary interface to receive auto-refresh commands sent by a memory controller; and,
a first secondary command interface, said buffer component to suppress a configured proportion of said auto-refresh commands, said buffer to send, via the first secondary command interface and to a first set of at least one memory component, a first at least one directed refresh command in a first communication interval corresponding to a first suppressed auto-refresh command.

9. The buffer component of claim 8, further comprising:
a second secondary command interface, the buffer component to send via the second secondary command interface and to a second set of at least one memory component, a second at least one directed refresh command in said first communication interval corresponding to the first suppressed auto-refresh command, the first at least one directed refresh command and the second at least one directed refresh command to have different addresses.

10. The buffer component of claim 9, wherein said different addresses comprise information that each specify a rank address, a bank address, and a row address.

11. The buffer component of claim 8, wherein said buffer component is programmable to set said configured proportion of said auto-refresh commands that are suppressed.

12. The buffer component of claim 8, further comprising:
nonvolatile memory to supply an address for said first at least one directed refresh command.

13. The buffer component of claim 12, wherein said nonvolatile memory is external to said buffer component, said nonvolatile memory supplying a first plurality of addresses corresponding to a first plurality of directed refresh commands.

14. The buffer component of claim 13, wherein said nonvolatile memory further supplies a second plurality of addresses corresponding to a second plurality of directed refresh commands, said first plurality of directed refresh commands to be sent via said first secondary interface during said first communication interval, said second plurality of directed refresh commands to be sent via said first secondary interface during a second communication interval.

15. A method of operating a memory module, comprising:
receiving a plurality of auto-refresh commands, the plurality of auto-refresh commands including a first auto-refresh command and a second auto-refresh command;
based on a configured proportion of received auto-refresh commands, sending the first auto refresh command to at least one memory component; and,
based on the configured proportion of received auto-refresh commands, suppressing the second auto-refresh command by not sending the second auto-refresh command to the at least one memory component.

16. The method of claim 15, further comprising:
receiving at least one proportion indicator, the at least one proportion indicator to configure a first proportion of the auto-refresh commands to be sent to the at least one memory component and a second proportion of the auto-refresh commands to be suppressed.

17. The method of claim 15, further comprising:
receiving a first at least one proportion indicator, the first at least one proportion indicator to configure a first proportion of the auto-refresh commands to be sent to the at least one memory component in a first rank of memory components; and,
receiving a second at least one proportion indicator, the second at least one proportion indicator to configure a second proportion of the auto-refresh commands to be sent to the at least one memory component in a second rank of memory components.

18. The method of claim 15, further comprising:
selecting a first proportion of the auto-refresh commands to be sent to the at least one memory component and selecting a second proportion of the auto-refresh commands to be suppressed; and,
in place of at least one of the second proportion of the auto-refresh commands, sending, to at least one memory component, an activate command directed to an address.

19. The method of claim 18, wherein said address comprises indicators that specify a rank address, a bank address, and a row address for the activate command.

20. The method of claim 18, further comprising:
receiving, from a nonvolatile memory included on said memory module, said address for use by said activate command.

* * * * *